(12) United States Patent
Kobayashi

(10) Patent No.: US 12,080,730 B2
(45) Date of Patent: Sep. 3, 2024

(54) PHOTOELECTRIC CONVERSION APPARATUS, PHOTOELECTRIC CONVERSION SYSTEM, AND MOVABLE BODY

(71) Applicant: CANON KABUSHIKI KAISHA, Tokyo (JP)

(72) Inventor: Daisuke Kobayashi, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 462 days.

(21) Appl. No.: 17/353,457

(22) Filed: Jun. 21, 2021

(65) Prior Publication Data

US 2021/0399031 A1 Dec. 23, 2021

(30) Foreign Application Priority Data

Jun. 23, 2020 (JP) ................................ 2020-107919

(51) Int. Cl.
*H01L 27/146* (2006.01)
*G01S 17/89* (2020.01)

(52) U.S. Cl.
CPC ........ *H01L 27/14607* (2013.01); *G01S 17/89* (2013.01); *H01L 27/14623* (2013.01)

(58) Field of Classification Search
None
See application file for complete search history.

(56) References Cited

U.S. PATENT DOCUMENTS

| 10,218,922 | B2* | 2/2019 | Kondo | H01L 27/14 |
| 11,688,753 | B2* | 6/2023 | Ito | H01L 27/14645 |
| | | | | 257/440 |
| 2014/0175592 | A1* | 6/2014 | Iwabuchi | H01L 27/1469 |
| | | | | 257/443 |
| 2016/0211306 | A1* | 7/2016 | Choi | H01L 27/1464 |
| 2017/0134670 | A1* | 5/2017 | Chao | H01L 27/14636 |
| 2017/0244913 | A1* | 8/2017 | Kobayashi | H01L 27/14636 |
| 2019/0252444 | A1 | 8/2019 | Ryoki | |
| 2020/0035737 | A1 | 1/2020 | Ito | |

(Continued)

FOREIGN PATENT DOCUMENTS

| JP | 2016171399 A | 9/2016 |
| JP | 2018056580 A | 4/2018 |
| JP | 2018182038 A | 11/2018 |

*Primary Examiner* — Evren Seven
(74) *Attorney, Agent, or Firm* — CANON U.S.A., INC. IP Division

(57) ABSTRACT

A photoelectric conversion apparatus includes a first chip including a first semiconductor element layer and a second chip including a second semiconductor element layer, the first chip and the second chip are bonded by a plurality of metal bonding portions between the first semiconductor element layer and the second semiconductor element layer, the plurality of pixel circuits includes a first pixel block including n (n is an integer of 3 or more) pixel circuits, and a second pixel block, the plurality of metal bonding portions includes a first metal bonding portion connecting the first semiconductor element layer and the second semiconductor element layer, and the number of the first metal bonding portions arranged at positions overlapping the first pixel block in a planar view is smaller than the number of the first metal bonding portions arranged at positions overlapping the second pixel block in a planar view.

28 Claims, 18 Drawing Sheets

(56) References Cited

U.S. PATENT DOCUMENTS

| | | |
|---|---|---|
| 2020/0092506 A1 | 3/2020 | Park |
| 2020/0260039 A1* | 8/2020 | Niwa .................... H04N 25/77 |
| 2021/0001889 A1 | 1/2021 | Furukawa |

* cited by examiner

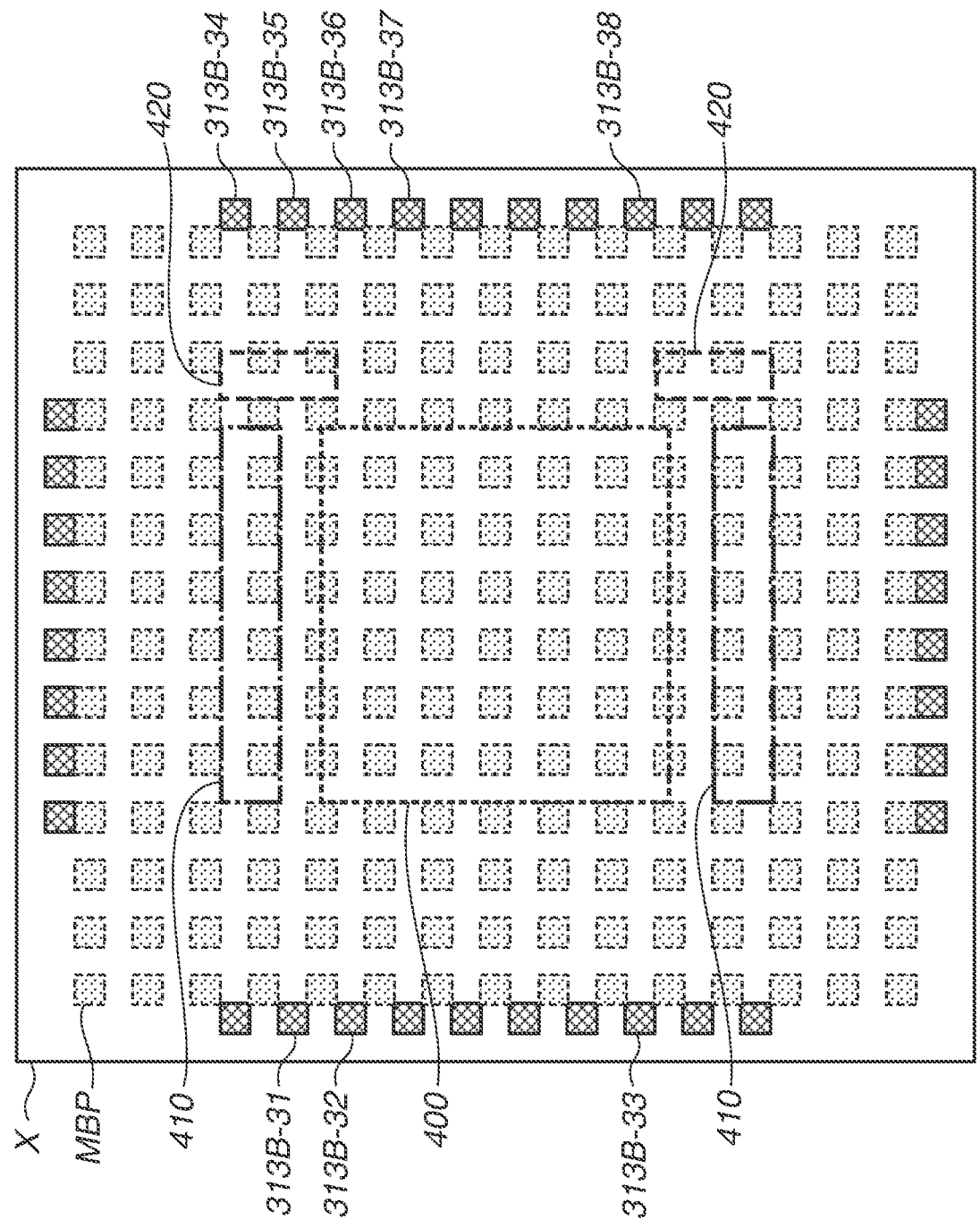

FIG.16B
FRONT VIEW
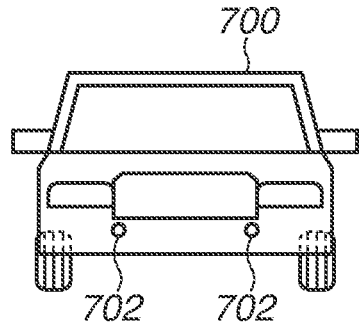
TOP VIEW
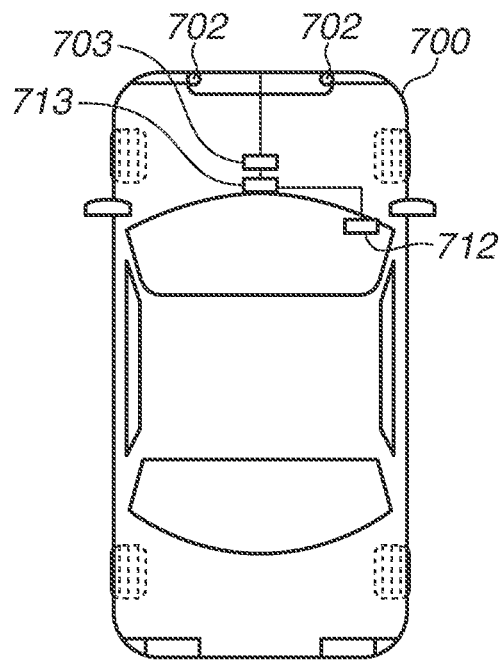
REAR VIEW
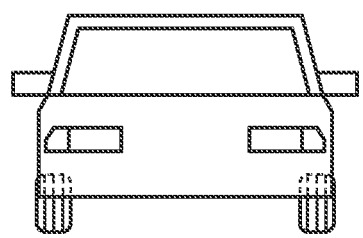

PHOTOELECTRIC CONVERSION APPARATUS, PHOTOELECTRIC CONVERSION SYSTEM, AND MOVABLE BODY

BACKGROUND

Field

The present disclosure relates to a photoelectric conversion apparatus.

Description of the Related Art

There has been known electrically connecting a plurality of chips stacked in a photoelectric conversion apparatus, via a metal bonding portion formed by bonding wiring patterns of the respective chips.

Japanese Patent Application Laid-Open No. 2018-056580 discusses a photoelectric conversion apparatus including a first chip having a first semiconductor element layer that includes a pixel region in which a plurality of pixels is two-dimensionally arranged, and a second chip having a second semiconductor element layer. The first chip and the second chip are stacked and bonded by a metal bonding portion.

The technique discussed in Japanese Patent Application Laid-Open No. 2018-056580 does not discuss a desirable arrangement position of the metal bonding portion connecting the first chip and the second chip, and the desirable number of metal bonding portions to be arranged. The technique discussed in Japanese Patent Application Laid-Open No. 2018-056580 has a possibility of improvements in the property of the photoelectric conversion apparatus by studying a desirable arrangement position of the metal bonding portion connecting the first chip and the second chip, and the desirable number of metal bonding portions to be arranged.

SUMMARY

The present disclosure is directed to a photoelectric conversion apparatus with an improved property.

According to an aspect of the present disclosure, a photoelectric conversion apparatus comprising a first chip including a first semiconductor element layer including a plurality of pixel circuits, and a second chip including a second semiconductor element layer, wherein the first chip and the second chip are bonded by a plurality of metal bonding portions between the first semiconductor element layer and the second semiconductor element layer, wherein the plurality of pixel circuits includes a first pixel block including n pixel circuits, wherein n is an integer larger than or equal to 3, and a second pixel block including a same number of pixel circuits as the first pixel block, wherein the plurality of metal bonding portions includes a first metal bonding portion connecting the first semiconductor element layer and the second semiconductor element layer, and wherein an arrangement pattern in the first pixel block of the first metal bonding portions arranged at positions overlapping the first pixel block in a planar view and an arrangement pattern in the second pixel block of the first metal bonding portions arranged at positions overlapping the second pixel block in a planar view are different.

According to another aspect of the present disclosure, a semiconductor apparatus comprising, a first chip including a first semiconductor element layer; and a second chip including a second semiconductor element layer, wherein the first chip and the second chip are bonded by a plurality of metal bonding portions between the first semiconductor element layer and the second semiconductor element layer, wherein the plurality of metal bonding portions includes a first metal bonding portion connecting the first semiconductor element layer and the second semiconductor element layer, wherein a first block overlapping o metal bonding portions of the plurality of metal bonding portions in a planar view, wherein o is an integer larger than or equal to 3, and a second block having a same area as the first block in a planar view, and overlapping a same number of metal bonding portions as the metal bonding portions arranged in the first block are included, and wherein an arrangement pattern in the first block of the first metal bonding portions arranged at positions overlapping the first block in a planar view and an arrangement pattern in the second block of the first metal bonding portions arranged at positions overlapping the second block in a planar view are different.

Further features of the present invention will become apparent from the following description of exemplary embodiments with reference to the attached drawings.

BRIEF DESCRIPTION OF THE DRAWINGS

FIG. 11 is an arrangement diagram of a pad and a metal bonding portion of a photoelectric conversion apparatus according to a fifth exemplary embodiment.

FIGS. 16A and 16B are concept diagrams of a photoelectric conversion system and a movable body according to an eighth exemplary embodiment.

DESCRIPTION OF THE EMBODIMENTS

Figure 1:
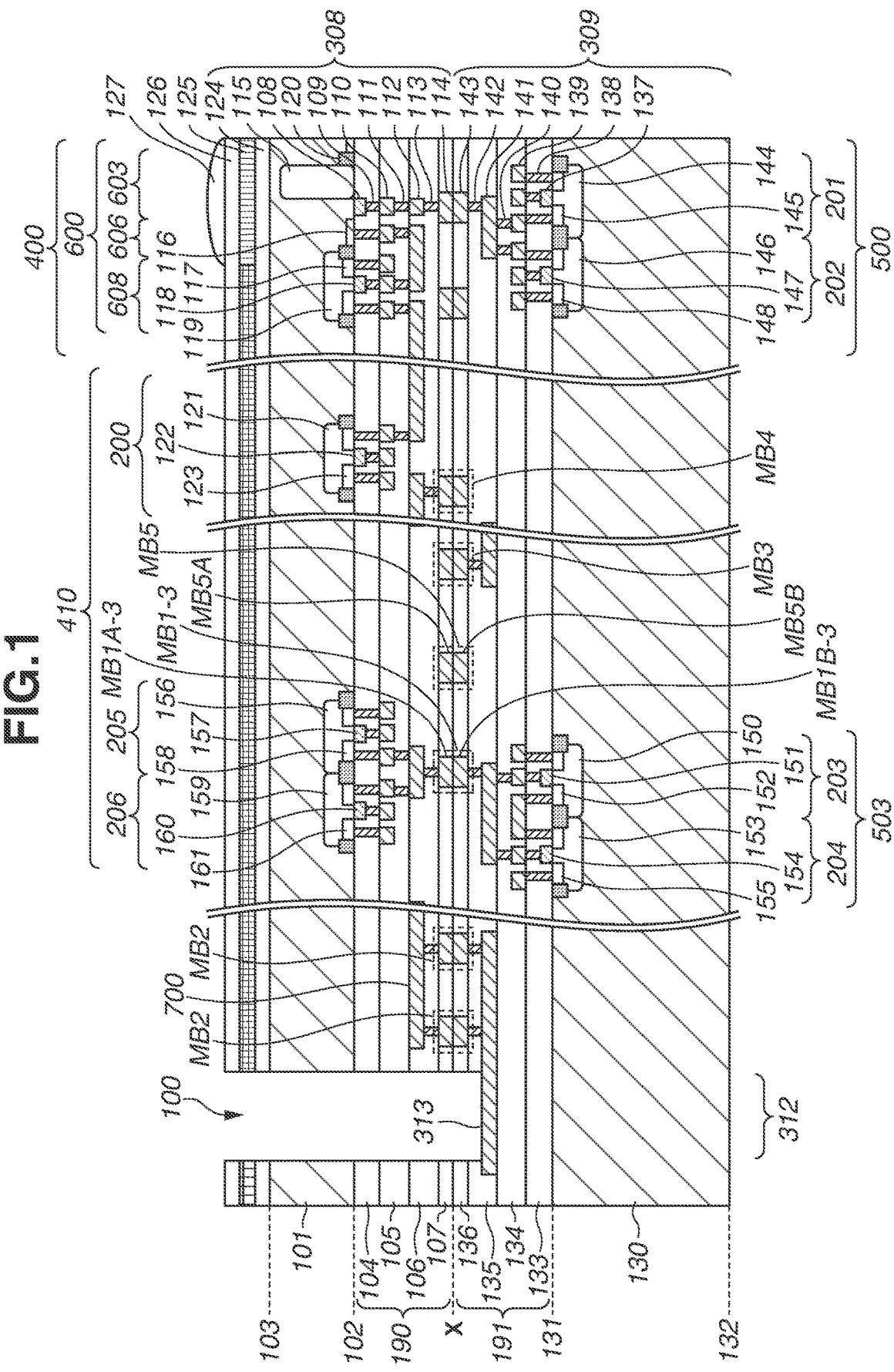
FIG. 1 is a cross-sectional schematic diagram of a photoelectric conversion apparatus according to a first exemplary embodiment.

The following exemplary embodiments are intended for embodying the technical ides of the present disclosure, and are not intended to limit the present disclosure. The sizes and positional relationships of members illustrated in the drawings are sometimes exaggerated for clarifying the description. In the following description, the same components are assigned the same reference numerals, and the redundant description will be sometimes omitted.

In the description for each exemplary embodiment, a principal surface of each semiconductor element layer refers to a surface (front surface) on which a transistor is formed. In addition, a back surface refers to a surface opposing the principal surface. An upper direction corresponds to a direction heading towards the back surface from the front surface of a semiconductor element layer 101, and a lower direction and a depth direction correspond to a direction heading towards the front surface from the back surface of the semiconductor element layer 101.

The following description will be given of a case where a signal carrier is an electron, but a signal carrier may be a hole. In this case, all of the polarities and conductivity types are inverted.

A photoelectric conversion apparatus according to a first exemplary embodiment of the present disclosure will be described with reference to FIGS. 1 to 5C. FIG. 1 is a cross-sectional schematic diagram of a photoelectric conversion apparatus according to each exemplary embodiment. The photoelectric conversion apparatus is a semiconductor device that can be used as an image sensor, a photometric sensor, or a distance measuring sensor, for example. The following description will be given of a case where an image sensor is used as an example of a photoelectric conversion apparatus.

As illustrated in FIG. 1, the photoelectric conversion apparatus is a stacked body of a chip 308 and a chip 309. The chip 308 includes the semiconductor element layer 101 and a wiring structure 190. In the present specification, a "semiconductor element layer" includes not only a semiconductor layer but also a gate of a transistor formed between semiconductor layers. A wiring layer and a contact plug of a wiring structure are not included in a "semiconductor element layer". The chip 309 includes a semiconductor element layer 130 and a wiring structure 191. The chip 308 and the chip 309 are stacked in such a manner that the wiring structure 190 of the chip 308 and the wiring structure 191 of the chip 309 are located between the semiconductor element layer 101 and the semiconductor element layer 130. In the present specification, a chip naturally includes a chip in a state of being separated from a wafer as illustrated in FIG. 1, and also includes a chip that is in a wafer state and is to be separated in the future.

The photoelectric conversion apparatus illustrated in FIG. 1 is a so-called back-illuminated photoelectric conversion apparatus in which light enters from a back surface 103 side of the semiconductor element layer 101, and a photoelectric conversion element receives the light.

The chip 308 and the chip 309 are bonded by a metal bonding portion MB formed by bonding a wiring line of a wiring layer located in a lowermost layer of the wiring structure 190, and a wiring line of a wiring layer located in an uppermost layer of the wiring structure 191. The metal bonding portion MB has a structure in which metal forming a wiring layer and metal forming a wiring layer are directly bonded. It can also be said that the bottom surface of the wiring structure 190 and the top surface of the wiring structure 191 are bonded at a bonding surface X. In other words, the chip 308 and the chip 309 are bonded at the bonding surface X. The bonding surface X is configured of the bottom surface of the wiring structure 190 and the top surface of the wiring structure 191. A connection member such as a micro bonding may be used between a wiring line of a wiring layer 114 and a wiring line of a wiring layer 143.

In FIG. 1, the metal bonding portion MB is formed by bonding the wiring line of the wiring layer 114 of the wiring structure 190 and the wiring line of the wiring layer 143 of the wiring structure 191. Hereinafter, a portion of the metal bonding portion MB that is included in the chip 308, i.e., a portion constituting a part of the wiring layer 114 will be sometimes referred to as a portion MBxA. In a similar manner, a portion of the metal bonding portion MB that is included in the chip 309, i.e., a portion constituting a part of the wiring layer 143 will be sometimes referred to as a portion MBxB. A major component of the metal bonding portion is desirably copper, for example. The major component being copper means that copper accounts for more than 90% of the all components.

As illustrated in FIG. 1, the photoelectric conversion apparatus according to the present exemplary embodiment includes a plurality of types of metal bonding portions MB. For example, the photoelectric conversion apparatus includes a metal bonding portion MB1 connecting the semiconductor element layer 101 and the semiconductor element layer 130, and a metal bonding portion MB unconnected with at least one of the semiconductor element layer 101 and the semiconductor element layer 130. Examples of the latter metal bonding portion MB include a metal bonding portion MB2, a metal bonding portion MB3, a metal bonding portion MB4, and a metal bonding portion MB5, which will be described below.

The metal bonding portion MB2 is a metal bonding portion that is connected with a wiring line located in an upper layer than the metal bonding portion MB2, and a wiring line located in a lower layer than the metal bonding portion MB2, and unconnected to at least one of the semiconductor element layers. From one aspect, the metal bonding portion MB2 is a metal bonding portion that includes via plugs connected to the top surface and the bottom surface, and is unconnected to at least one of the semiconductor element layers. From another aspect, the metal bonding portion MB2 is a metal bonding portion that includes protruding portions provided on the top surface and the bottom surface, and is unconnected to at least one of the semiconductor element layers. In the present specification, the "via plug" may be a member formed separately from a wiring line of a wiring layer, or may be a member integrally formed using a dual damascene method.

The metal bonding portion MB3 is a metal bonding portion that is connected with a wiring line located in a lower layer than the metal bonding portion MB3, and has a top surface entirely contacting interlayer insulating material. From one aspect, the metal bonding portion MB3 is a metal bonding portion that includes a via plug connected to the bottom surface, and has the top surface entirely contacting interlayer insulating material. From another aspect, the metal bonding portion MB3 is a metal bonding portion that has a bottom surface on which a protruding portion formed, and has a top surface on which a protruding portion is not formed.

The metal bonding portion MB4 is a metal bonding portion that is connected with a wiring line located in an upper layer than the metal bonding portion MB4, and has a bottom surface entirely contacting interlayer insulating material. From one aspect, the metal bonding portion MB4 is a metal bonding portion that includes a via plug connected to the top surface, and has the bottom surface entirely contacting interlayer insulating material. From another aspect, the metal bonding portion MB4 is a metal bonding portion that has a top surface on which a protruding portion is formed, and has a bottom surface on which a protruding portion is not formed.

The metal bonding portion MB5 is a metal bonding portion unconnected with a wiring line located in an upper layer than the metal bonding portion MB5, and a wiring line located in a lower layer than the metal bonding portion MB5. From one aspect, the metal bonding portion MB5 is a metal bonding portion having the top surface and the bottom surface to which via plugs are unconnected. From another aspect, the metal bonding portion MB5 is a metal bonding portion having the top surface and the bottom surface entirely contacting interlayer insulating material.

In FIG. 1, all types of metal bonding portions corresponding to the metal bonding portions MB2 to MB5 are included, but it is sufficient that the metal bonding portion MB1 and at least any one type of the metal bonding portions MB2 to MB5 are included. In addition, in FIG. 1, the metal bonding portion MB2, the metal bonding portion MB3, and the metal bonding portion MB4 are unconnected with both of the semiconductor element layer 101 and the semiconductor element layer 130, but may have a configuration of being connected with either one of the semiconductor element layer 101 and the semiconductor element layer 130, and unconnected with the other one.

Figure 2A:
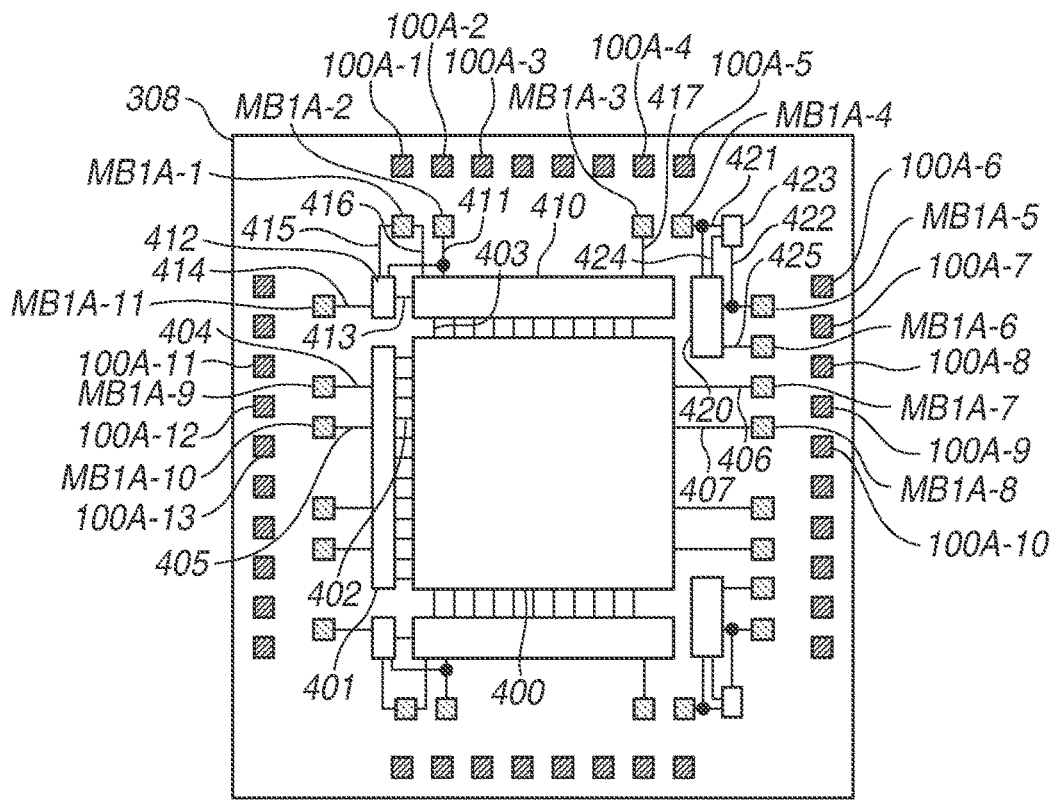
FIGS. 2A, 2B, and 2C are planar schematic diagrams of the photoelectric conversion apparatus according to the first exemplary embodiment.
Figure 2B:
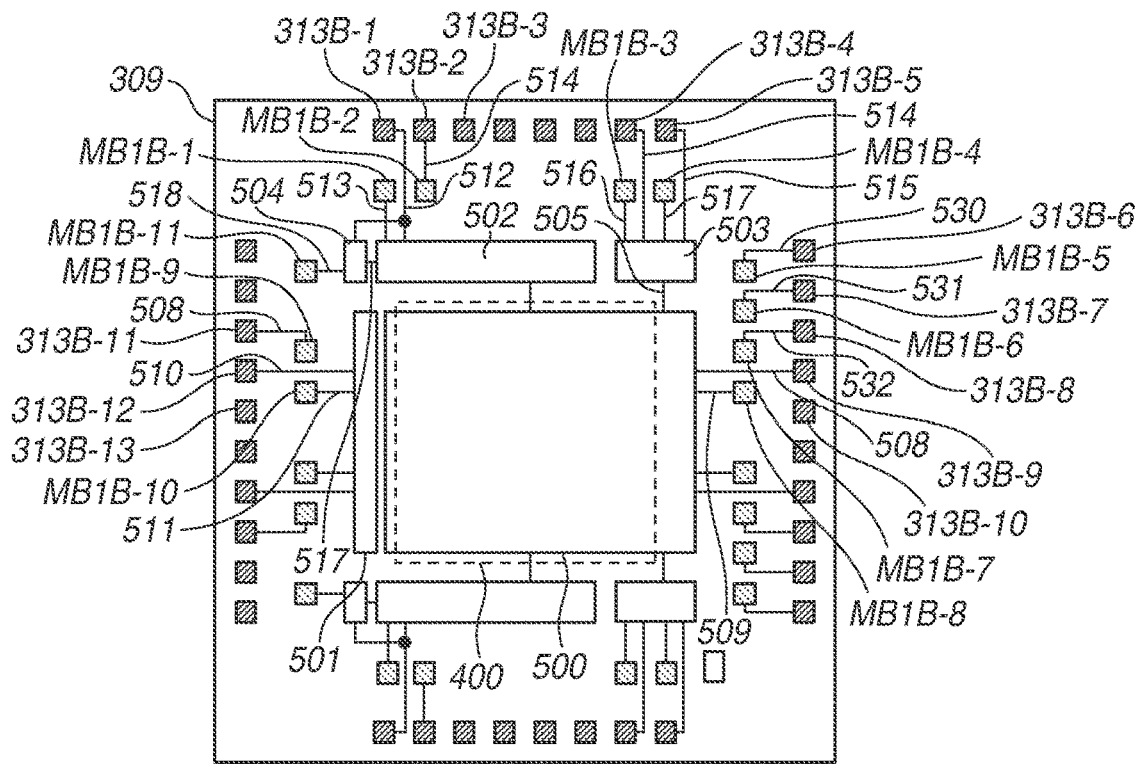
Figure 2C:
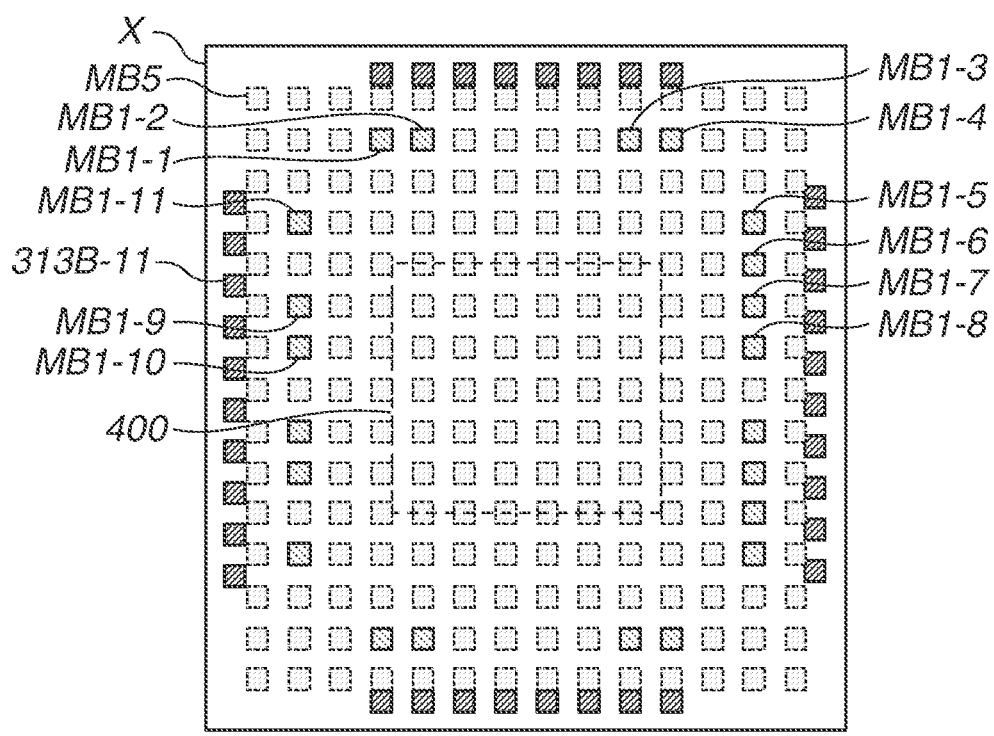

The details of the configuration of the chip 308 and the configuration of the chip 309 will be described with reference to FIGS. 1 to 3. FIG. 2A is a planar schematic diagram of the chip 308. FIG. 2B is a planar schematic diagram of the chip 309. FIG. 2C is a planar schematic diagram of each metal bonding portion MB on the bonding surface X. For the sake of explanatory convenience, FIGS. 2A and 2B do not illustrate a part of wiring layers, a contact plug, and a via plug. In addition, in the planar diagrams in FIGS. 2A and 2B, the metal bonding portion MB1 is illustrated in an arrangement relationship not physically overlapping each component such as a pixel region 400 and a timing control circuit 500. Actually, as illustrated in the arrangement of the pixel region 400 and the timing control circuit 500 in FIG. 1, the metal bonding portion MB1 can be arranged immediately above or immediately below a component via a plurality of wiring layers. In addition, as illustrated in FIGS. 1 and 2A to 2C, a metal bonding portion of a signal between members is arranged at a common position between members. In FIGS. 2A and 2B, components arranged in a peripheral region portion are arranged vertically-symmetrically. The reference numerals of vertically-symmetrically arranged components and the metal bonding portion MB are partially omitted for simplifying the drawings. In the present specification, a "plane" refers to a surface parallel to the bonding surface X between the chip 308 and the chip 309. In addition, a "planar view" refers to a view from a direction vertical to the bonding surface X.

First of all, the chip 308 will be described.

A semiconductor layer of the semiconductor element layer 101 is a silicon semiconductor substrate, for example. The semiconductor element layer 101 includes the pixel region 400 in which pixel circuits of a plurality of pixels 600 are arranged in a two-dimensional array in a planar view. The pixel 600 converts an optical signal into an electrical signal and outputs the converted signal. The pixel 600 can indicate a minimum unit of circuits cyclically-arranged for forming an image. In addition, a pixel circuit that is included in the pixel 600 and arranged in the semiconductor element layer 101 is only required to include at least a photoelectric conversion element 603. The photoelectric conversion element 603 is an element that generates electrons and holes by photoelectric conversion. For example, a photodiode can be used as the photoelectric conversion element 603. The pixel circuit may include a component other than a photoelectric conversion element. For example, the pixel circuit may further include at least any one of a transfer transistor, floating diffusion (FD), a reset transistor, an amplification transistor, a capacity addition transistor, and a selection transistor. Typically, the pixel 600 includes a selection transistor and a group of elements connected to a signal line via the selection transistor. In other words, the selection transistor can be an outer rim of the pixel circuit. Alternatively, an amplification transistor can be an outer rim of the pixel circuit. Alternatively, the pixel 600 sometimes may include a set of a photoelectric conversion element and a transfer transistor. Alternatively, the pixel 600 may include a set of one or a plurality of photoelectric conversion elements, and one amplification circuit or one AD conversion circuit. The following description will be given of a case where an amplification transistor 608 illustrated in FIG. 3 serves as an outer rim in a pixel circuit arranged in the semiconductor element layer 101. A part of components of the pixel 600 may be arranged in the semiconductor element layer 101, and the other part of the components may be arranged in the semiconductor element layer 130. In this case, the components of the pixel circuit in the pixel 600 that are arranged in the semiconductor element layer 101 may include the photoelectric conversion element 603.

Figure 3:
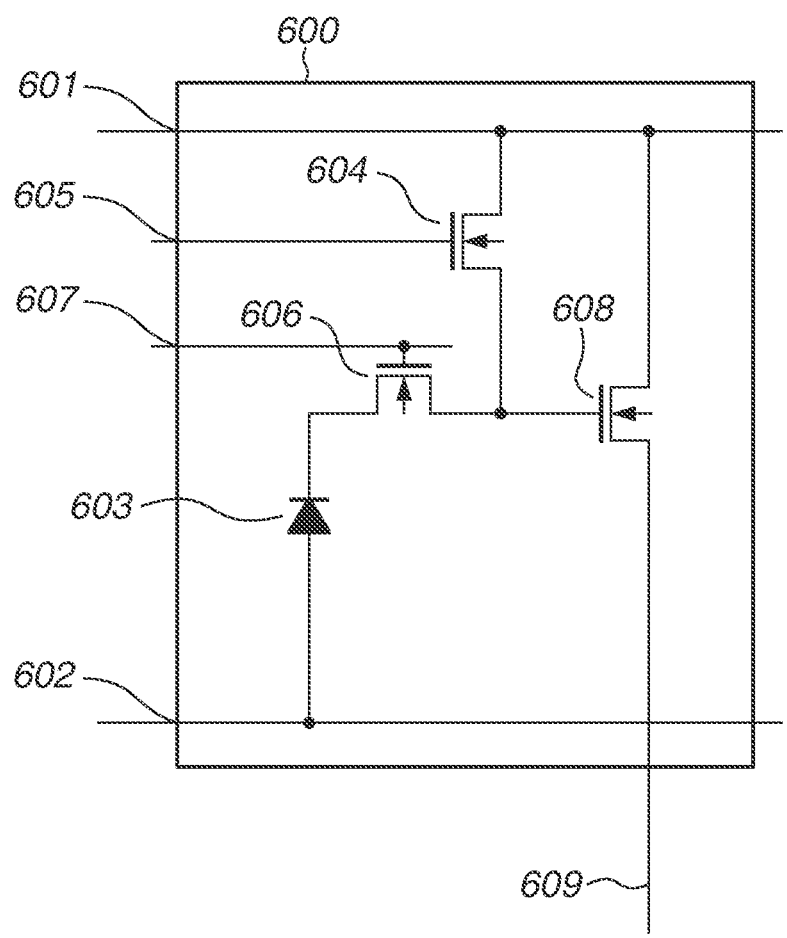
FIG. 3 is an equivalent circuit diagram of a pixel of the photoelectric conversion apparatus according to the first exemplary embodiment.

A pixel circuit illustrated in FIG. 3 includes a power line 601, a grounding line 602, the photoelectric conversion element 603, a reset transistor 604, a transfer transistor 606, the amplification transistor 608, and an output line 609. The reset transistor 604 and the transfer transistor 606 are respectively controlled by a reset control line 605 and a transfer control line 607. The output line 609 is an output line shared by a plurality of pixels 600, and is connected to a wiring line 403. Wiring lines 402 and 407 for controlling reset and transfer, and a wiring line 406 for supplying a power source voltage are connected to the pixel region 400. The pixel circuit of the pixel 600 is arranged in the semiconductor element layer 101 as illustrated in FIG. 1. FIG. 1 illustrates the photoelectric conversion element 603, the transfer transistor 606, and the amplification transistor 608, and does not illustrate the reset transistor 604.

As illustrated in FIG. 1, the semiconductor element layer 101 includes an n-type semiconductor region 115 forming the photoelectric conversion element 603, an n-type semiconductor region 116 serving as a drain of the transfer transistor 606, and an element isolation structure 120. The transfer transistor 606 includes the n-type semiconductor region 115, the n-type semiconductor region 116, and a gate electrode 108. Electric charges accumulated in the n-type semiconductor region 115 are transferred to the n-type semiconductor region 116 by the gate electrode 108. A potential that is based on the electric charges transferred to the n-type semiconductor region 116 is connected to the gate electrode 118 of the amplification transistor 608 via a contact plug 109, a wiring line of a wiring layer 110, a via plug 111, and a wiring line of a wiring layer 112. An n-type semiconductor region 117 forming a source/drain region of the amplification transistor 608 is arranged in a well 119. A source of the amplification transistor 608 is connected to the power line 601 illustrated in FIG. 3, and a drain is connected to the output line 609 illustrated in FIG. 3. A drain of the amplification transistor 608 is connected to a signal processing circuit 410 via a contact plug, the wiring line of the wiring layer 110, a via plug, and the wiring line of the wiring layer 112.

FIG. 1 illustrates an N-type transistor 200 that is a partial element of the signal processing circuit 410. The N-type transistor 200 includes a well 121, an n-type semiconductor region 123 forming a source/drain region of the N-type transistor, and a gate electrode 122. In the present exemplary embodiment, a reference potential is connected to the gate electrode 122 of the N-type transistor 200, and a source electrode is connected to the grounding line 602. A drain electrode is connected to a drain of the amplification transistor 608 via the contact plug 109, a wiring pattern of the wiring layer 110, a via plug, and a wiring pattern of the wiring layer 112. In this example, a source follower circuit is constituted by the amplification transistor 608 and the N-type transistor 200 of the signal processing circuit 410.

The photoelectric conversion element may be a pinned photodiode further including a p-type semiconductor region, or may be a photogate, and can be appropriately changed.

The signal processing circuit 410 further includes an inverter circuit including an N-type transistor 205 and a P-type transistor 206. The inverter circuit outputs a pixel signal converted into a digital signal, to a signal processing control circuit 503 of the chip 309 via a metal bonding portion MB1-3. The metal bonding portion MB1-3 is connected to gate electrodes 151 and 154 of an inverter circuit including an N-type transistor 203 and a P-type transistor 204, via a via plug, a wiring line of a wiring layer 141, a via plug, and a wiring line of a wiring layer. The N-type transistor 205 includes a well 156, an n-type semiconductor region 158 forming a source/drain region of the N-type transistor, and a gate electrode 157. The P-type transistor 206 includes a well 159, a p-type semiconductor region 161 forming a source/drain region of the P-type transistor, and a gate electrode 160. A source of the N-type transistor 205 is connected to a grounding potential, and a drain is connected to a contact plug, the wiring line of the wiring layer 110, a via plug, and the wiring line of the wiring layer 112. On the other hand, a source of the P-type transistor 206 is connected to a power source potential, and a drain is connected to a contact plug, the wiring line of the wiring layer 110, a via plug, and the wiring line of the wiring layer 112. In the present exemplary embodiment, drains of the N-type transistor 205 and the P-type transistor 206 are connected by the wiring pattern of the wiring layer 112, and form an inverter circuit. The wiring line of the wiring layer 112 to which the drains of the N-type transistor 205 and the P-type transistor 206 are connected is further connected to the wiring line of the wiring layer 143 via a via plug and the wiring line of the wiring layer 114. As described above, the metal bonding portion MB is formed by bonding the respective wiring lines of the wiring layers 114 and 143.

The wiring line of the wiring layer 114 is connected to the gate electrode 108 of the transfer transistor 606 via a via plug, the wiring line of the wiring layer 112, a via plug, the wiring line of the wiring layer 110, and a contact plug. In the pixel 600 of the chip 308, an electric charge transfer operation is controlled from the timing control circuit 500 of the chip 309. A connection relationship of these components corresponds to the wiring line 407 and a metal bonding portion MB1A-8 in FIG. 2A, and the metal bonding portion MB1B-8 and a wiring line 509 in FIG. 2B.

In a pad portion 312, a pad wiring line 313 for connecting with an external terminal, and an opening 100 for exposing a part of the pad wiring line 313 are arranged. In FIG. 1, the pad wiring line 313 is connected to a wiring line 700 of the wiring layer 112 via the metal bonding portion MB2, and via plugs connected to the top surface and the bottom surface of the metal bonding portion MB2. The wiring line 700 is a power line, for example, and supplies power to components arranged on the chip 308. In FIG. 1, the pad wiring line 313 and the wiring line 700 are connected by a plurality of metal bonding portions MB2. This can reduce parasitic resistance of the metal bonding portion MB2. In FIG. 1, the pad wiring line 313 is arranged in the wiring layer 141 of the chip 309, but an arrangement position is not limited to this. For example, the pad wiring line 313 may be arranged in any wiring layer of the wiring structure 190, or the pad wiring line 313 may be arranged in an upper layer than the semiconductor element layer 101.

The wiring structure 190 includes M (M is an integer larger than or equal to 1) wiring layers, interlayer insulating material, and a contact plug connecting a wiring layer and the semiconductor element layer 101. A wiring layer of a certain layer and a wiring layer at a different height may be connected via a via plug. The number of interlayer insulating layers, the number of wiring layers, the number of via plugs, and the number of contact plugs, which are included in the wiring structure 190, can be arbitrarily set. In FIG. 1, the wiring structure 190 includes three wiring layers 110, 112, and 114, and interlayer insulating materials 104 to 107 arranged between wiring layers and between wiring patterns included in wiring layers. The wiring structure 190 further includes via plugs 111 and 113 connecting wiring layers, and the contact plug 109 connecting the wiring layer 110 and the semiconductor element layer 101.

On the back surface 103 side of the semiconductor element layer 101, in a region overlapping the pixel region 400 in a planar view, a planarization layer 124, a color filter layer 125 including a plurality of color filters, a planarization layer 126, and a microlens layer 127 including a plurality of microlenses are arranged in this order. FIG. 1 illustrates one pixel 600. Actually, a plurality of pixels 600 is arrayed. In addition, each of the plurality of color filters and each of the plurality of microlenses may be arranged to correspond to one photoelectric conversion element. One microlens and one color filter may be provided for a plurality of photoelectric conversion elements.

Next, the chip 309 will be described. The following description will be mainly given of the configuration of the chip 309 illustrated in FIG. 1, and the components not illustrated in FIG. 1 will be described below with reference to FIG. 2B.

A semiconductor layer of the semiconductor element layer 130 is a silicon semiconductor substrate, for example. The semiconductor element layer 130 includes an electrical circuit. For example, an electrical circuit is any one of transistors constituting a vertical scanning circuit 501, a horizontal scanning circuit 502, the signal processing control circuit 503, a clock generation circuit 504, and the timing control circuit 500, which are illustrated in FIG. 2B.

The timing control circuit 500 is a circuit that controls the driving of at least any one transistor of a pixel circuit.

In the example illustrated in FIG. 1, a part of the timing control circuit 500 and a part of the signal processing control circuit 503 are arranged on the chip 309.

The timing control circuit 500 is a circuit that controls the entire photoelectric conversion apparatus. FIG. 1 illustrates, as a partial circuit of the timing control circuit 500, an inverter circuit including an N-type transistor 201 and a P-type transistor 202. An n-type semiconductor region 145 forming a source/drain region of the N-type transistor 201 is formed in a well 144. The N-type transistor 201 includes an n-type semiconductor region 145 forming a source/drain region, and a gate electrode 137. A P-type semiconductor region 148 forming a source/drain region of the P-type transistor 202 is formed in a well 146. The P-type transistor 202 includes a p-type semiconductor region 148 forming a source/drain region, and a gate electrode 147. A source of the N-type transistor 201 is connected to a grounding potential, and a drain is connected to a contact plug, a wiring line of a wiring layer 139, a via plug, and a wiring line of the wiring layer 141. On the other hand, a source of the P-type transistor 202 is connected to a power source potential, and a drain is connected to a contact plug, the wiring line of the wiring layer 139, a via plug, and the wiring line of the wiring layer 141. The wiring line of the wiring layer 141 to which drain electrodes of the N-type transistor 201 and the P-type transistor 202 are connected is further connected to the wiring line of the wiring layer 114 of the chip 308 via a via of a contact layer 142, and the wiring line of the wiring layer 143.

In this example, the N-type transistor 203 and the P-type transistor 204 are arranged as a partial circuit of the signal processing control circuit 503. An n-type semiconductor region 152 forming a source/drain region of the N-type transistor 203 is formed in a well 150. The N-type transistor 203 includes the n-type semiconductor region 152 forming a source/drain region, and a gate electrode 151. A p-type semiconductor region 155 forming a source/drain region of the P-type transistor 204 is formed in a well 153. The P-type transistor 204 includes the p-type semiconductor region 155 forming a source/drain region, and a gate electrode 154. A source electrode of the N-type transistor 203 is connected to a grounding potential, and a drain electrode is connected to the wiring line of the wiring layer 139 via a contact of a contact layer 138. A source electrode of the P-type transistor 204 is connected to a power source potential, and a drain electrode is connected to the wiring line of the wiring layer 139 via the contact of the contact layer 138. In the present exemplary embodiment, the drain electrodes of the N-type transistor 203 and the P-type transistor 204 are connected by the wiring line of the wiring layer 139.

The wiring structure 191 includes N (N is an integer larger than or equal to 1) wiring layers, an interlayer insulating material, and a contact plug connecting the semiconductor element layer 130 and the wiring layers. Two wiring layers may be connected by a via plug. The number of interlayer insulating films, the number of wiring layers, the number of contacts, and the number of via plugs, which are included in the wiring structure 191, can be arbitrarily set. In FIG. 1, the wiring structure 191 includes three wiring layers 140, 142, and 143, and interlayer insulating materials 133 to 136 arranged between wiring layers, and between wiring patterns included in the wiring layers. The wiring structure 191 further includes via plugs 141 and 142 connecting wiring layers at different heights, and a contact plug connecting a wiring pattern of the wiring layer 140 and the semiconductor element layer 130.

In FIG. 2A, an electrical circuit that transmits a signal for driving a photoelectric conversion element arranged in the pixel region 400, for example, is arranged in a peripheral region. More specifically, a pixel control circuit 401, the signal processing circuit 410, signal generation circuits 412 and 423, and an output unit 420 are arranged in the peripheral region. The electrical circuit is any one of transistors constituting the pixel control circuit 401, the signal processing circuit 410, the signal generation circuits 412 and 423, and the output unit 420, for example.

The wiring lines 406 and 407 are connected to the chip 309 via metal bonding portions MB1A-7 and MB1A-8, and supplied with power and drive signals. In FIGS. 2A and 2B, the wiring lines 406 and 407 and the metal bonding portions MB1A-7 and MB1A-8 are each illustrated as a single component. Actually, a plurality of wiring lines and a plurality of metal bonding portions MB1 are arranged like a plurality of power lines, a plurality of grounding lines, and a plurality of control lines. In addition, even if the same power and the same signal are supplied, for reducing resistance of wiring lines and metal bonding portions MB1, a plurality of wiring lines and a plurality of metal bonding portions MB1 are sometimes arranged. In the following description, even if a plurality of wiring lines and a plurality of metal bonding portions MB1 are desirably arranged, input-output signals transmitted via wiring lines and metal bonding portions MB1 will be omitted for simplifying the drawings and descriptions.

The pixel control circuit 401 controls, via a wiring line 402, photoelectric conversion, transfer, and reset of a photoelectric conversion element included in the pixel region 400, and the selection of a row from which a pixel signal is to be output. The pixel control circuit 401 receives power and a grounding potential from the chip 309 via a metal bonding portion MB1A-9 and a wiring line 404, for example. Because the power and the grounding potential have different potentials, the power and the grounding potential are actually supplied from two different metal bonding portions and wiring lines, which are not illustrated in the drawings as described above. In addition, a control signal is supplied from the chip 309 via a metal bonding portion MB1A-10 and a wiring line 405.

A signal output from the pixel region 400 is input to the signal processing circuit 410 via the wiring line 403. The signal processing circuit 410 includes a constant current circuit, for example, forms a source follower circuit by connecting with the amplification transistor 608 of the pixel 600 via the output line 609, and amplifies a pixel signal. Furthermore, the signal processing circuit 410 may be configured to convert a pixel signal being an analog signal, into a digital signal by performing analog/digital conversion (A/D conversion) of an output from the source follower circuit. As another function, the signal processing circuit 410 may have a function of further amplifying a source follower circuit output, a correlated double sampling (CDS) function, and a function of sampling and holding (S/H) a pixel signal. In addition, the signal processing circuit 410 may include a digital memory storing an A/D conversion result, and a scanning unit for reading out digital data stored in the digital memory. As an example, the signal processing circuit 410 according to the present exemplary embodiment is configured to convert a pixel signal into a digital signal, store the digital data of one pixel into the digital memory as a plural-bit digital signal, and concurrently output digital data of one pixel. The signal processing circuit 410 receives power and a grounding potential from the chip 309 via a metal bonding portion MB1A-2 and a wiring line 411. In addition, a control signal is supplied from the chip 309 via a metal bonding portion MB1A-1 and a wiring line 416. A pixel signal processed by the signal processing circuit 410 is output to the chip 309 via a wiring line 417 and a metal bonding portion MB1A-3.

The signal generation circuit 412 is a circuit that generates various signals to be supplied to the signal processing circuit 410. For example, the signal generation circuit 412 generates a drive clock and a reference voltage to be used in an A/D conversion operation of the signal processing circuit 410, and supplies the generated drive clock and reference voltage to the signal processing circuit 410 via a wiring line 413. A power source voltage and a grounding voltage are supplied from the chip 309 to the signal generation circuit 412 via the metal bonding portion MB1A-2 and the wiring line 411. In FIG. 2A, the same power source voltage and grounding voltage as the signal processing circuit 410 are supplied. Actually, a different power source voltage and a different grounding voltage may be supplied. In addition, a control signal is supplied from the chip 309 to the signal generation circuit 412 via the metal bonding portion MB1A-1, a wiring line 415, a metal bonding portion MB1A-11, and a wiring line 414.

The output unit 420 has a function for outputting a pixel signal processed by the chip 309, to the outside of the photoelectric conversion apparatus. For example, the output unit 420 has an output function of a method of outputting a voltage from a single terminal like a buffer circuit, or an output function of a low voltage differential signaling (LVDS) method having differential two terminals. In addition, if a pixel signal is a digital signal as in the present exemplary embodiment, the output unit 420 may have a parallel-serial conversion (P/S conversion) function, for example. A power source voltage and a grounding voltage are supplied from the chip 309 to the output unit 420 via a metal bonding portion MB1A-5 and a wiring line 422.

The signal generation circuit 423 is a circuit that generates various signals to be supplied to the output unit 420. For example, the signal generation circuit 423 generates a reference voltage and a clock for driving P/S conversion or LVDS, and supplies the generated reference voltage and clock to the output unit 420 via a wiring line 424. Similarly to the output unit 420, a power source voltage and a grounding voltage are supplied to the signal generation circuit 423 via the metal bonding portion MB1A-5 and the wiring line 422.

Next, the configuration of the chip 309 will be described with reference to FIG. 2B. Also in the description of FIG. 2B, similarly to FIG. 2A, power source voltages, grounding voltages, and control signals are actually supplied from a plurality of wiring lines and metal bonding portions, which are omitted in the drawing and description. A circuit that generates a control signal for driving a component of the chip 308, and a circuit that processes a signal from a photoelectric conversion element of the chip 308 are arranged on the chip 309. In addition, a plurality of pad wiring lines 313 to which a potential is supplied from the outside of the photoelectric conversion apparatus is arranged on the chip 309. Examples of methods of supplying a potential from the outside of the photoelectric conversion apparatus include a method of supplying a potential to the pad wiring line 313 via wire bonding, and a method of forming embedded metal and supplying a potential using a bump. The following description will be given of a case where wire bonding is used as an example.

For wire bonding, the chip 308 needs to be opened at a position corresponding to an arrangement position of the pad wiring line 313 of the chip 309. FIG. 2A illustrates a plurality of openings 100 for clarifying a positional relationship of pad wiring lines 313 arranged on the chip 309. More specifically, openings 100A-1 to 100A-13 illustrated in FIG. 2A are opening portions of pad wiring lines 313B-1 to 313B-13 of the chip 309. Specifically, the opening 100A-1 corresponds to the pad wiring line 313B-1, the opening 100A-2 corresponds to the pad wiring line 303B-2, and the remaining openings similarly correspond to the remaining pad wiring lines.

A power source voltage, a grounding voltage, and a control signal from the outside of the photoelectric conversion apparatus are supplied to the timing control circuit 500 from the pad wiring line 313B-9 via a wiring line 508. The control signal from the outside of the photoelectric conversion apparatus is a control signal for serial communication from an external controller (not illustrated), for example. A protection circuit is connected in parallel or in series to at least a part of or desirably all of pad wiring lines 313B. This can reduce electrical damage to pad wiring lines 313B during wire bonding or a manufacturing process.

In addition, a control signal is supplied to the chip 308 via the wiring line 509 and the metal bonding portion MB1B-8. Further, in the present exemplary embodiment, driving of a part of the pixel region 400 is controlled via the metal bonding portion MB1A-8 of the chip 308 and the wiring line 407.

A power source voltage, a grounding voltage, and a control signal are supplied to the vertical scanning circuit 501 from the pad wiring line 313B-12 and a wiring line 510, and the vertical scanning circuit 501 drives the pixel control circuit 401 of the chip 308 via a wiring line 511 and the metal bonding portion MB1B-10. The control of the pixel region 400, such as photoelectric conversion, transfer, reset, and the selection of a row from which a pixel signal is to be output, is performed by the vertical scanning circuit 501.

A power source voltage, a grounding voltage, and a control signal are supplied to the horizontal scanning circuit 502 and the clock generation circuit 504 from the pad wiring line 313B-1 and a wiring line 512. The horizontal scanning circuit 502 drives the signal processing circuit 410 and the signal generation circuit 412 of the chip 308 via a wiring line 513 and the metal bonding portion MB1B-1. The clock generation circuit 504 is a phase locked loop (PLL) circuit, for example, and is controlled in tandem with the horizontal scanning circuit 502 via a wiring line 517. A control signal and a clock generated by the clock generation circuit 504 are supplied to the signal generation circuit 412 via a wiring line 518 and the metal bonding portion MB1B-11.

A power source voltage, a grounding voltage, and a control signal are supplied to the signal processing control circuit 503 from the pad wiring line 313B-4, a wiring line 514, the pad wiring line 313B-5, and a wiring line 515. In the present exemplary embodiment, different power source voltages are supplied to the signal processing control circuit 503, and pad wiring lines 313 are explicitly separated. Plural-bit pixel signals converted into digital signals from analog signals by the signal processing circuit 410 of the chip 308 are input to the signal processing control circuit 503 via the wiring line 417, the metal bonding portion MB1A-3, the metal bonding portion MB1B-3, and a wiring line 516. The input pixel signals are subjected to various types of digital signal processing such as addition or subtraction of digital gain or offset, compression processing, and scramble processing of data. The pixel signals having been subjected to digital signal processing are input to the output unit 420 of the chip 308 via a wiring line 517, the metal bonding portion MB1B-4, the metal bonding portion MB1A-4, and a wiring line 421. In addition, the signal processing control circuit 503 also supplies a signal synchronized with digital signal processing of pixel signals, to the signal generation circuit 423 of the chip 308 via a wiring line 517, the metal bonding portion MB1B-4, the metal bonding portion MB1A-4, and the wiring line 421. In the present exemplary embodiment, the signal processing control circuit 503 is driven by different power sources depending on the signal processing circuit 410 and the output unit 420 having different power sources. An output of the output unit 420 is output to the outside of the photoelectric conversion apparatus from the pad wiring line 313B-7 via a wiring line 425, the metal bonding portion MB1A-6, the metal bonding portion MB1B-6, and a wiring line 531.

FIG. 2C illustrates a plan view of the bonding surface X. In addition, a position of the pixel region 400 is indicated by a broken line. In FIG. 2C, for maintaining in-plane uniformity of the bonding surface, patterns of metal bonding portions are arranged approximately uniformly over the entire surface. As described with reference to FIG. 1, metal bonding portions connected to the semiconductor element layer 101 and the semiconductor element layer 130 are indicated as the metal bonding portions MB1. In addition, metal bonding portions unconnected with wiring lines located in an upper layer than the metal bonding portion MB5, and wiring lines located in a lower layer than the metal bonding portion MB5 are indicated as the metal bonding portions MB5. In FIG. 2C, at least any one of the metal bonding portions MB2 to MB4 may be used in place of the metal bonding portion MB5. The metal bonding portions MB2 to MB5 need not be necessarily arranged, and only the metal bonding portion MB1 may be arranged.

In FIG. 2A, the pixel region 400 has a configuration of being driven from the right and left via the wiring lines 402 and 407. The configuration is not limited to this. The metal bonding portions MB5 located immediately below the pixel region 400, which are illustrated in FIG. 2C, may be replaced with the metal bonding portions MB1 by connecting a control signal, and the pixel region 400 may thus be controlled. The pixel region 400 has a configuration in which pixel blocks each including n (n is an integer larger than or equal to 3) pixels 600 are two-dimensionally arrayed. It is desirable that each pixel block includes m columns×l rows (m is an integer larger than or equal to 2, l is an integer larger than or equal to 2) pixels. A pixel block includes n neighboring pixels 600. A first pixel block and a second pixel block include different pixels. As an example, pixel blocks are segmented by the control of a drive timing. For example, an accumulation period of signal electric charges of the first pixel block can be controlled to a first period, and an accumulation period of signal electric charges of the second pixel block can be controlled to a second period different from the first period. With this configuration, an accumulation time most suitable for each pixel block can be controlled depending on the luminance of a subject in each of two-dimensionally arrayed pixel block regions, and a dynamic range of a captured image can be expanded. Hereinafter, an example in which a pixel block is controlled by a drive timing will be described in detail, but the control configuration is not limited to this configuration. Even if drive timings are the same, pixels in an arbitrary range may be selected, and the plurality of selected pixels may be segmented as one block. For example, the first pixel block may include n pixel circuits, and the second pixel block may include the same number of pixel circuits as the first pixel block. Even in this case, there is room for improvement in the property of the photoelectric conversion apparatus.

Next, a connection relationship between the pixel 600 arranged in the pixel region 400 of the chip 308, and the components arranged on the chip 309 will be described.

First of all, a connection relationship between pixels 600 in the pixel region 400 of the chip 308, and a part of the timing control circuit 500 of the chip 309 according to a comparative example will be described with reference to FIGS. 4A and 4B. After that, a connection relationship between the chip 308 and the chip 309 according to the present exemplary embodiment will be described with reference to FIGS. 5A and 5B.

Figure 4A:
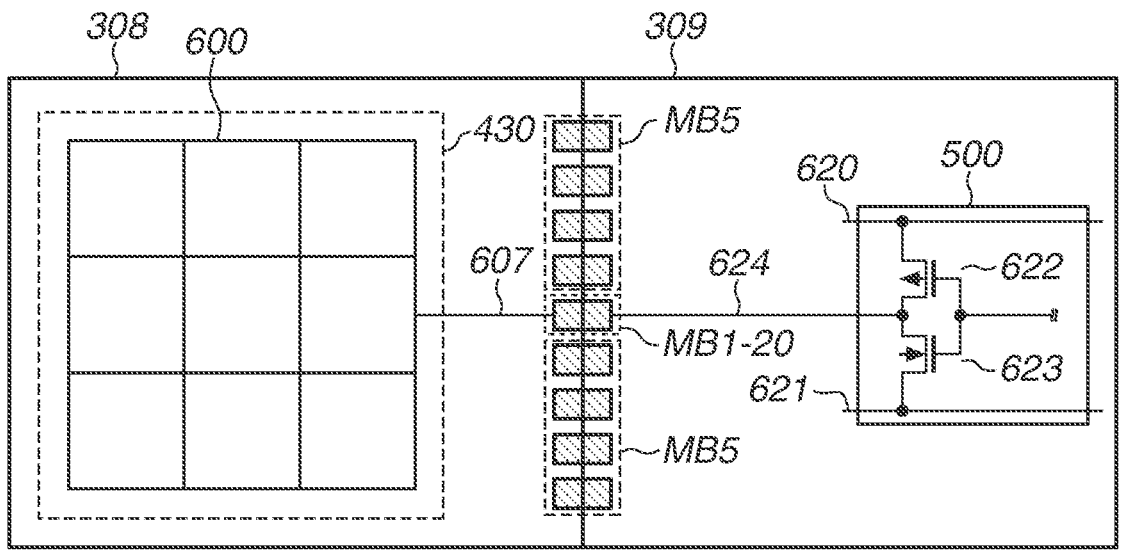
FIGS. 4A and 4B are arrangement diagrams of a metal bonding portion of a pixel portion of a photoelectric conversion apparatus according to a comparative example.

The chip 308 illustrated in FIG. 4A includes a pixel block 430, from among the pixel region 400, that includes pixels 600 blocked in three rows and three columns. FIG. 4A illustrates a connection relationship between the pixel block 430 and a circuit that controls a pixel transfer operation of the timing control circuit 500. The circuit that controls the pixel transfer operation is an inverter circuit including a power line 620, a grounding line 621, a P-type transistor 622, and an N-type transistor 623. In the example illustrated in FIG. 4A, the pixel block 430 is driven via a common transfer control line 607. The pixels 600 arranged in the semiconductor element layer 101 of the chip 308 and the timing control circuit 500 arranged in the semiconductor element layer 130 of the chip 309 are connected by the metal bonding portion MB1-20. More specifically, the pixel block 430 is controlled from the timing control circuit 500 via a wiring line 624, the metal bonding portion MB1-20, and the transfer control line 607. As described with reference to FIG. 2C, in FIG. 4A, for maintaining the uniformity of arrangement of metal bonding portions, a plurality of metal bonding portions MB5 is arranged. At least any one of the metal bonding portions MB2 to MB4 may be used in place of the metal bonding portion MB 5.

Figure 4B:
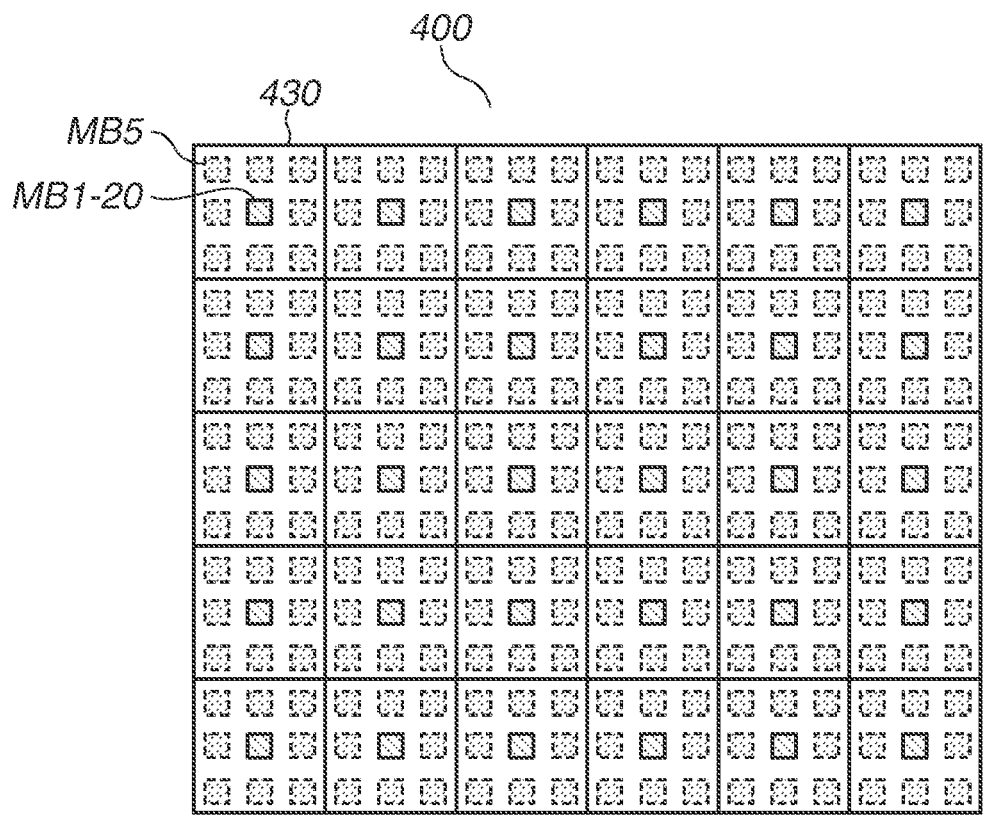

FIG. 4B illustrates an arrangement relationship between the pixel block 430, the metal bonding portion MB1-20, and the metal bonding portion MB5. In the pixel region 400, the pixel blocks 430 each including a plurality of pixels 600 are arranged in five rows and six columns, but the configuration is not limited to this. In each of the pixel blocks 430, nine metal bonding portions MB1 and MB5 in total are arranged. Among the metal bonding portions, a signal line for controlling pixel transfer is connected to the metal bonding portion MB1-20. Among pixels 600 included in the pixel block 430 and arranged in three rows and three columns, the metal bonding portion MB1-20 is arranged at a position overlapping a pixel 600 arranged in the second row and the second column, and the metal bonding portions MB5 are arranged at positions overlapping the other pixels 600. In other words, among nine metal bonding portions MB arranged at positions overlapping the pixel block 430, a signal line is connected at a ratio of 1/9.

Next, a connection relationship between pixels 600 of pixel blocks 430 and 432 and a pad wiring line 313-8 arranged on the chip 309 according to the present exemplary embodiment will be described with reference to FIGS. 5A and 5B.

Figure 5A:
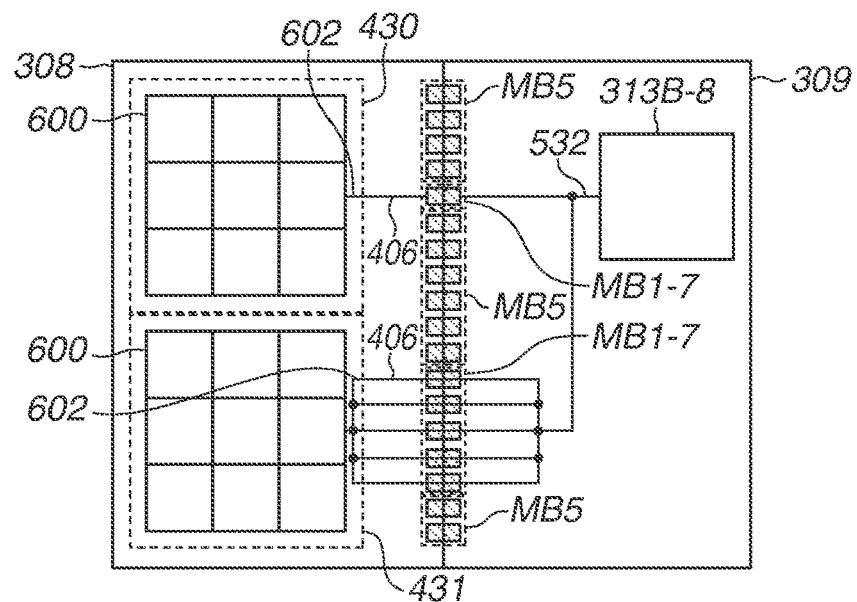
FIGS. 5A, 5B, and 5C are schematic diagrams illustrating a connection relationship between members of the photoelectric conversion apparatus according to the first exemplary embodiment.

FIG. 5A is a diagram illustrating a connection relationship between a grounding line 602 of the pixels 600 of the chip 308, and the pad wiring line 313-8 of the chip 309. The chip 308 includes pixel blocks 430 and 431, which constitute a part of the pixel region 400. The pad wiring line 313-8 arranged on the chip 309 is connected to the grounding lines 602 of the pixel blocks 430 and 431 via a wiring line 532, a plurality of metal bonding portions MB1-7, and a plurality of wiring lines 406. The pixel block 430 is connected with the pad wiring line 313-8 by the metal bonding portion MB1-7 connected by one metal bonding portion among a plurality of metal bonding portions corresponding to the pixel block 430. The pixel block 431 is connected with the pad wiring line 313-8 by the metal bonding portions MB1-7 connected by five metal bonding portions among a plurality of metal bonding portions corresponding to the pixel block 431.

Figure 5B:
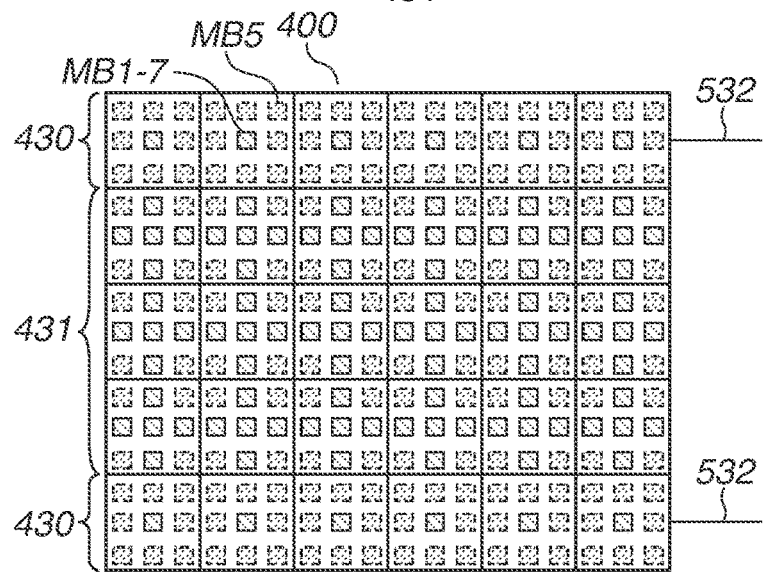

FIG. 5B is a diagram illustrating the arrangement and a connection relationship of the metal bonding portions MB1-7 and MB5 in the pixel region 400 as for the configuration of connection between the members described with reference to FIG. 5A. In FIG. 5B, among pixel blocks arranged in five rows and six columns, the pixel blocks 430 are arranged in the first and fifth rows, and the pixel blocks 431 are arranged in the second to fourth rows. In addition, the wiring line 532 is arranged immediately below the pixel region 400. Similarly to FIG. 5A, in each of the pixel blocks 430, nine metal bonding portions MB1 and MB5 are arranged. Among the nine metal bonding portions, one metal bonding portion MB1-7 connected with the pad wiring line 313-8 is arranged. In other words, nine metal bonding portions MB arranged at positions overlapping in a planar view are connected to the pad wiring line 313-8 at a ratio of 1/9. On the other hand, in the pixel block 431, nine metal bonding portions MB1 and MB5 are arranged. Among the nine metal bonding portions, five metal bonding portions MB1-7 are connected with the pad wiring line 313-8. In other words, nine metal bonding portions MB arranged at positions overlapping the pixel block are connected to the pad wiring line 313-8 at a ratio of 5/9.

As illustrated in FIG. 5B, the number of metal bonding portions MB1-7 arranged to correspond to the pixel block 430, and the number of metal bonding portions MB1-7 arranged to correspond to the pixel block 431 are different. In other words, the number of metal bonding portions MB1 arranged at positions overlapping the pixel block 430 in a planar view, and the number of metal bonding portions MB1 arranged at positions overlapping the pixel block 431 in a planar view are different. More specifically, the arrangement of the pixel blocks differ in that the number of metal bonding portions MB1 arranged at positions overlapping the pixel block 430 in a planar view is smaller than the number of metal bonding portions MB1 arranged at positions overlapping the pixel block 431. In addition, the number of metal bonding portions of the pixel block 431 that are unconnected with at least one of a first semiconductor element layer and a second semiconductor element layer is smaller than the number of metal bonding portions of the pixel block 430 that are unconnected with at least one of the first semiconductor element layer and the second semiconductor element layer. In this manner, the number of metal bonding portions MB1 is varied between pixel blocks.

For example, if a plurality of pixel blocks is arranged in a column direction, a pad wiring line 313B-8 may be arranged near pixel blocks in the first row and pixel blocks in the last row. The wiring line 532 has a finite resistance value determined depending on a manufacturing process to be used. Thus, the pixel blocks 430 in the first row and the last row are connected with the wiring lines 532 and the pad wiring line 313-8 with relatively lower resistance than the pixel blocks 431 located therebetween. In other words, a distance between the pixel block 431 and the pad wiring line 313B-8 is longer than a distance between the pixel block 430 and the pad wiring line 313B-8. The "distance" refers to a shortest distance. In addition, the metal bonding portion MB1 also has a finite resistance value. If the number of metal bonding portions MB1 is larger, resistance becomes lower, and if the number of metal bonding portions MB1 is smaller, resistance becomes higher. Thus, resistance components of the metal bonding portion MB1-7 between the wiring lines 532 and 406 of the pixel block 430 are higher than resistance components of the metal bonding portions MB1-7 between the wiring lines 532 and 406 of the pixel block 431.

If a voltage drop amount of a power line or a grounding line due to interconnection resistance varies in the plane of the pixel region 400, shading of a captured image is sometimes caused. In the present exemplary embodiment, the number of metal bonding portions MB is adjusted based on interconnection resistance components generated depending on the arrangement position of the pad wiring line 313-8, and a value of resistance from the pad wiring line 313-8 to the pixel block 430 or 431 is adjusted. A difference in resistance value is thereby reduced. With this configuration, shading due to a difference in voltage drop amount of a grounding potential between pixel blocks is prevented.

Figure 5C:
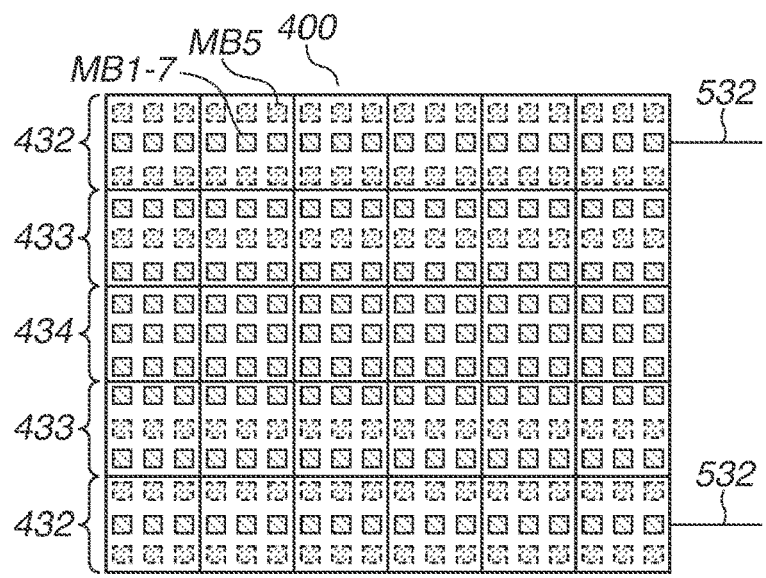

In FIG. 5B, the arrangement position of the metal bonding portion MB1 is the center of each pixel block, but a connection position is not limited thereto. In addition, arrangement positions of metal bonding portions MB1 may be different from each other among a plurality of pixel blocks. In addition, in FIG. 5B, a plurality of pixel blocks located between the first row and the last row are the same, but as illustrated in FIG. 5C, pixel blocks 432 to 434 different for each row may be arranged. Furthermore, pixel blocks different for each column may be arranged, or pixel blocks different for each row and each column may be arranged.

An example in which a pixel block is formed for each transfer operation of the pixel 600 has been described with reference to FIGS. 5A, 5B, and 5C, but the configuration is not limited to this. For example, a unit of a pixel block may be determined based on a unit of the number of pixels to be subjected to a reset operation, or a unit of the number of pixels to be read. Alternatively, a region or a block unit may be determined based on a resistance value of a power line or a grounding line of a pixel, and the number or density of metal bonding portions may be adjusted so as to reduce a resistance difference between blocks. In addition, also when a signal connected at a metal bonding portion is a control line as described with reference to FIG. 4A, the number or density of metal bonding portions within a pixel block may be changed for adjusting interconnection resistance as a method for reducing a difference in control waveform between pixel blocks.

In addition, the configuration of the photoelectric conversion apparatus such as the components to be arranged on the chip 308 and the chip 309, and the combination of components is not limited to the configuration described in the present exemplary embodiment. For example, only the pixel region 400 may be arranged on the chip 308, and a signal processing circuit and a control circuit may be arranged on the chip 309. Alternatively, each of pixels included in a pixel region may have a configuration including a signal processing function such as an A/D converter.

In the present exemplary embodiment, in a configuration including a plurality of unit blocks in which a plurality of metal bonding portions can be arranged, like the pixel blocks 430 to 434, a resistance value of a metal bonding portion can be adjusted in a pixel block by adjusting the number or density of metal bonding portions for each pixel block. With this configuration, a resistance component of a power line or a grounding line connected to the pixel region 400 can be adjusted for each region of a pixel block, and image degradation such as shading due to a difference in resistance between pixel blocks can be suppressed.

A photoelectric conversion apparatus according to a second exemplary embodiment of the present disclosure will be described with reference to FIGS. 6A and 6B. The photoelectric conversion apparatus according to the second exemplary embodiment is different from the photoelectric conversion apparatus according to the first exemplary embodiment in that the pixel region 400 includes a pixel block 435 including effective pixels, and the pixel block 430 including light shielded pixels, and the number of metal bonding portions MB1-7 varies between the pixel block 430 and the pixel block 435. Components similar to those of the photoelectric conversion apparatus according to the first exemplary embodiment illustrated in FIGS. 1 to 5C are assigned the same reference numerals, and the description thereof will be omitted or simplified.

Figure 6A:
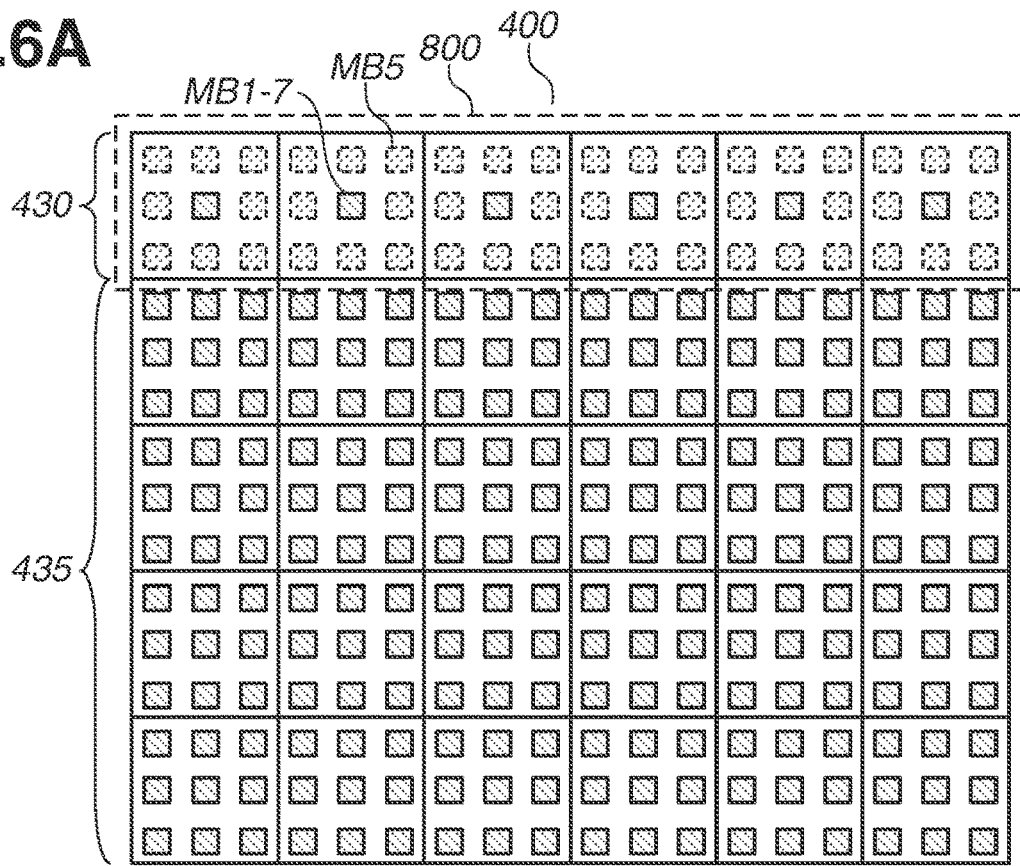
FIGS. 6A and 6B are arrangement diagrams of a metal bonding portion of a pixel portion of a photoelectric conversion apparatus according to a second exemplary embodiment.

FIG. 6A is a diagram illustrating a planar schematic diagram of an arrangement of the pixel blocks 430 and 435, and an arrangement of the metal bonding portions MB1-7. As a configuration example of the photoelectric conversion apparatus, an optical light shielding portion is sometimes arranged in a part of the pixel region 400. For example, light shielding can be achieved by providing a light shielding film on at least one of the top surface and the bottom surface of the planarization layer 124 in FIG. 1, and covering a part of the pixel region 400 with the light shielding film. In FIG. 6A, a light shielding portion 800 is arranged at a position overlapping the pixel blocks 430 arranged in the first row of the pixel region 400. A unit of a pixel block may be determined depending on the number of rows and the number of columns of a required light-shielded region.

In some cases, the potential of the light shielding portion 800 is fixed so that a variation of the light shielding portion 800 caused by disturbance noise does not affect the pixel region 400 via a parasitic capacitance. For example, by connecting the light shielding portion 800 with a power line of a pixel block or a grounding line via a via plug, the potential of the light shielding portion 800 can be set to the same potential as a power source line or a grounding potential of the pixel 600. With this configuration, the light shielding portion 800 also serves as a wiring line of a power source of the pixel 600 or a grounding line. Thus, the interconnection resistance of a power line or a grounding line becomes smaller. In other words, in a region in which the pixel block 430 is arranged, as compared with a region in which the pixel block 435 is arranged, the interconnection resistance of a power source line or a grounding line is relatively small. A difference in resistance of a power source line or a grounding line can cause a difference in output of the pixel 600 or a difference in shading shape. Accordingly, by arranging the light shielding portion 800, an output property difference due to a resistance difference of a power source line or a grounding line is sometimes generated between a light-shielded region and an open region. When various types of signal processing such as correction of a pixel signal of an opening portion are performed using a pixel output of the light shielding portion 800, signal processing accuracy or a desired signal processing result sometimes fails to be obtained due to inconsistency in output property between an open region and a light-shielded region in which the light shielding portion 800 is arranged.

In the present exemplary embodiment, at least one of the number and density of metal bonding portions MB1-7 to which a power source line or a grounding line is connected is varied between the pixel block 430 and the pixel block 435. With this configuration, it is possible to reduce a difference in interconnection resistance value of a power source line or a grounding line between the light shielding portion 800 and other open regions, and reduce a difference in dark-state output property between the light shielding portion 800 and the open regions.

In addition, like the pixel control circuit 401 and the signal processing circuit 410 in FIG. 2A, a power source line and a grounding line are shared by the pixel region 400 and components adjacent to the pixel region 400. In this case, similarly to the case where the light shielding portion 800 is arranged, which has been described with reference to FIG. 6A, interconnection resistance of a boundary region between the pixel region 400 and the other components becomes relatively lower than that of the center region of the pixel region 400. Thus, an output difference is sometimes generated between the center region and a peripheral region of the pixel region 400. FIG. 6B illustrates a configuration in which the pixel blocks 435 are arranged in three rows and four columns at the center, and the pixel blocks 430 are arranged at the periphery of the pixel region 400. By employing the configuration illustrated in FIG. 6B, even in a case where a power source line and a grounding line are shared by the pixel region 400 and the peripheral components, it is possible to reduce a difference in interconnection resistance value of a power source line and a grounding line, and reduce an output difference between the center region and the peripheral region of the pixel region 400.

Figure 6B:
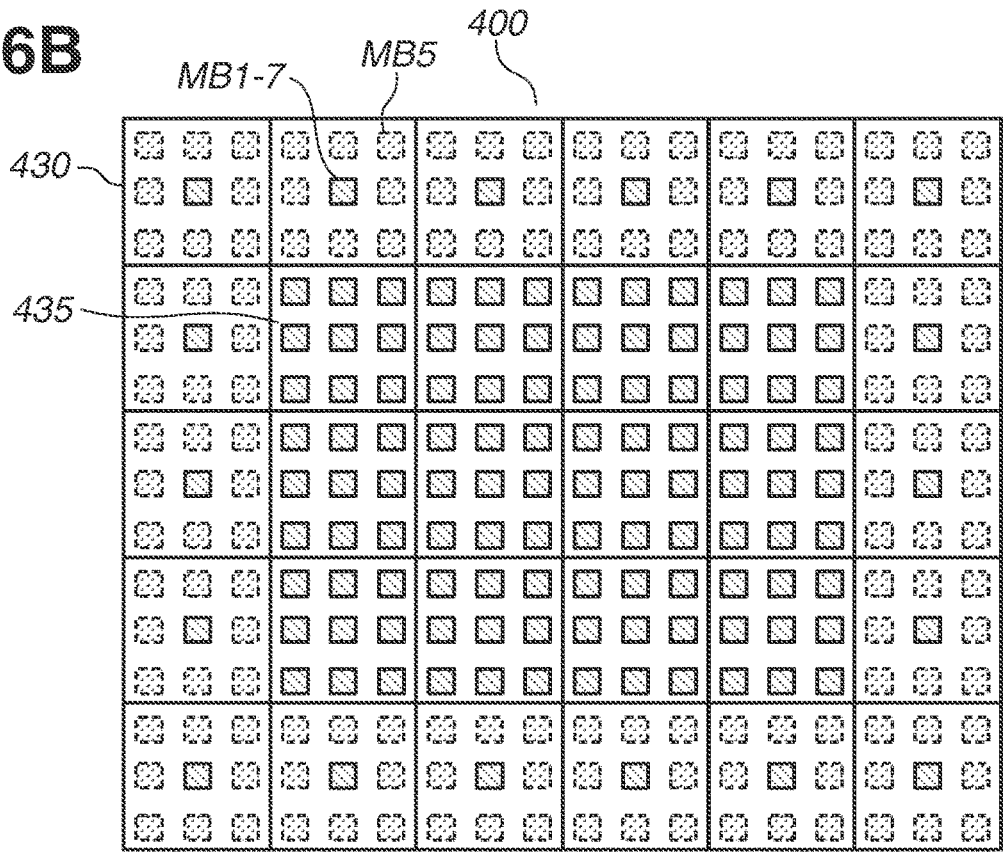

Also in the present exemplary embodiment, similarly to the first exemplary embodiment, a unit of a pixel block is not limited to the configuration illustrated in FIGS. 6A and 6B.

Also in the present exemplary embodiment, in a configuration including a plurality of unit blocks in which a plurality of metal bonding portions can be arranged like a pixel block, by adjusting the number or density of metal bonding portions for each unit block, it is possible to adjust a resistance value of a metal bonding portion for each unit block. With this configuration, it is possible to adjust a resistance component of a power line or a grounding line connected to the pixel region 400, for each region of a unit block, and suppress image degradation such as shading due to a difference in resistance between regions.

In addition, in FIG. 6B, also in another component that shares a power source line and a grounding line with the pixel region 400, such as the signal processing circuit 410, a resistance distribution of a power source line and a grounding line is generated in the vicinity of the pixel region 400 and other regions. Also in the signal processing circuit 410, by adjusting the number or density of metal bonding portions of a power source line and a grounding line for each block unit or region similarly to a pixel block, for example, it is possible to adjust a resistance distribution in the signal processing circuit 410. With this configuration, one-dimensional shading generated in another component such as the signal processing circuit 410 can be suppressed.

A photoelectric conversion apparatus according to a third exemplary embodiment of the present disclosure will be described with reference to FIG. 7. The photoelectric conversion apparatus according to the present exemplary embodiment is different from the photoelectric conversion apparatus according to the first exemplary embodiment in that the number and the arrangement pattern of metal bonding portions MB1 are at random for each pixel block in pixel blocks within the pixel region 400. Components similar to those of the photoelectric conversion apparatuses according to the first and second exemplary embodiments illustrated in FIGS. 1 to 6B are assigned the same reference numerals, and the description will be omitted or simplified.

As described in the first and second exemplary embodiments, depending on the resistance distribution of a power source line or a grounding line in the pixel region 400, an output of the pixel 600 sometimes has an output property that is based on the resistance distribution. This serves as one factor of deteriorating image quality by a horizontally or vertically continuous output having an output property with specific tendency, such as shading, for example. In particular, a continuously-changing output property is likely to be recognized as a shape in a captured image.

Figure 7:
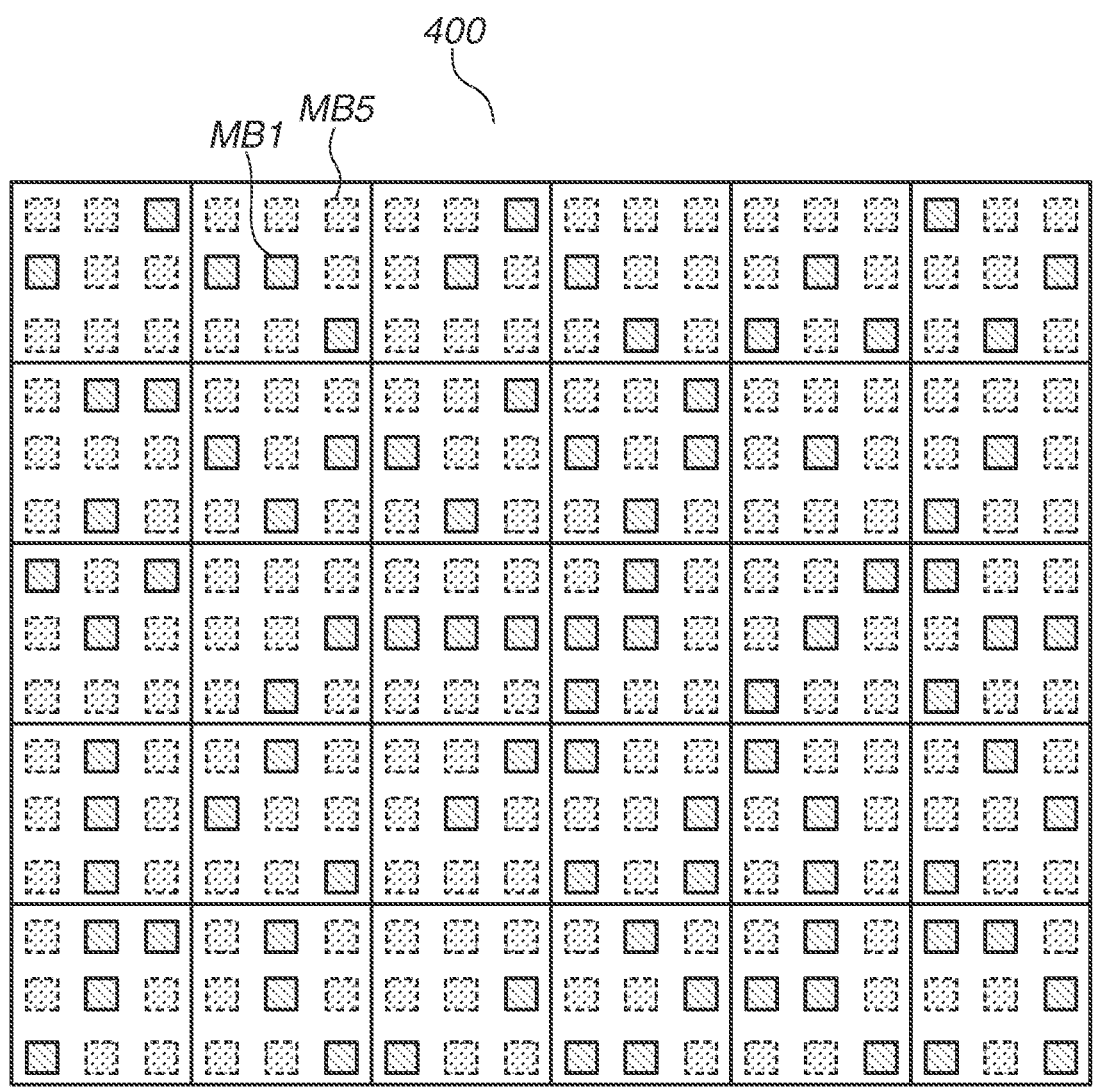
FIG. 7 is an arrangement diagram of a metal bonding portion of a pixel portion of a photoelectric conversion apparatus according to a third exemplary embodiment.

As illustrated in FIG. 7, because a plurality of pixel blocks having different numbers and arrangement patterns of metal bonding portions MB are arranged at random, a distribution of interconnection resistances of a power line or a grounding line does not become a continuous distribution. More specifically, an arrangement pattern in a first pixel block of metal bonding portions MB1 arranged at positions overlapping the first pixel block in a planar view and an arrangement pattern in a second pixel block of metal bonding portions MB1 arranged at positions overlapping the second pixel block in a planar view are different. In other words, when the metal bonding portions MB1 arranged at positions overlapping the first pixel block in a planar view and the metal bonding portions MB1 arranged at positions overlapping the second pixel block in a planar view are overlaid, the metal bonding portions MB1 are arranged at different positions. Overlaying the metal bonding portions MB1 arranged at positions overlapping the first pixel block in a planar view and the metal bonding portions MB1 arranged at positions overlapping the second pixel block in a planar view refers to translating and overlaying the metal bonding portions MB1. Not all the metal bonding portions MB1 need not be arranged at different positions, and it is sufficient that at least one of the metal bonding portions MB1 is arranged at a different position.

According to the present exemplary embodiment, an output property due to a distribution of interconnection resistance becomes less likely to be recognized as a continuous output property.

For further preventing image degradation, a configuration of defining a difference in density of metal bonding portions MB between adjacent pixel blocks, or a configuration of determining the number or density of metal bonding portions MB for each pixel block in accordance with a resistance distribution of a wiring line may be employed. A pixel block in which a metal bonding portion MB is not arranged may exist.

In the first and second exemplary embodiments, the description has been given of the configuration of suppressing image degradation by reducing a difference in interconnection resistance that is caused in accordance with the arrangement position of the pad wiring line 313, the arrangement of the light shielding portion 800, and an interconnection relationship of components arranged around the pixel region 400. In the present exemplary embodiment, in a configuration including a plurality of unit blocks in which a plurality of metal bonding portions MB can be arranged like a pixel block 436, it is possible to suppress an output property of a specific pattern by varying the number or density of metal bonding portions MB between unit blocks.

A photoelectric conversion apparatus according to a fourth exemplary embodiment of the present disclosure will be described with reference to FIGS. 8A, 8B, and 9. The photoelectric conversion apparatus according to the present exemplary embodiment is different from the photoelectric conversion apparatus according to the first exemplary embodiment in that the number of metal bonding portions MB1 within a pixel block varies from one end toward another end. Components similar to those of the photoelectric conversion apparatuses according to the first, second, and third exemplary embodiments illustrated in FIGS. 1 to 7 are assigned the same reference numerals, and the description will be omitted or simplified.

Figure 8A:
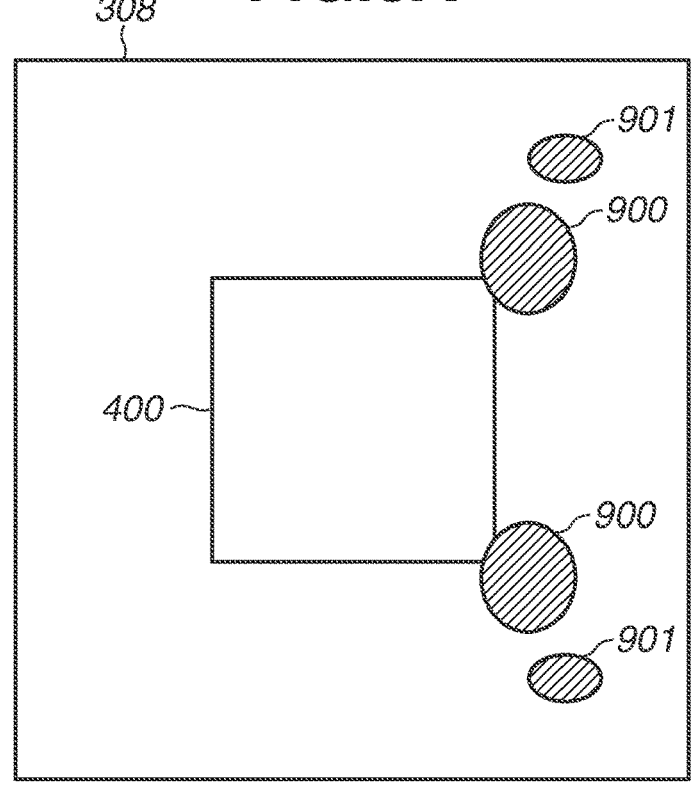
FIGS. 8A and 8B are schematic diagrams of a thermal distribution of a photoelectric conversion apparatus according to a fourth exemplary embodiment.
Figure 8B:
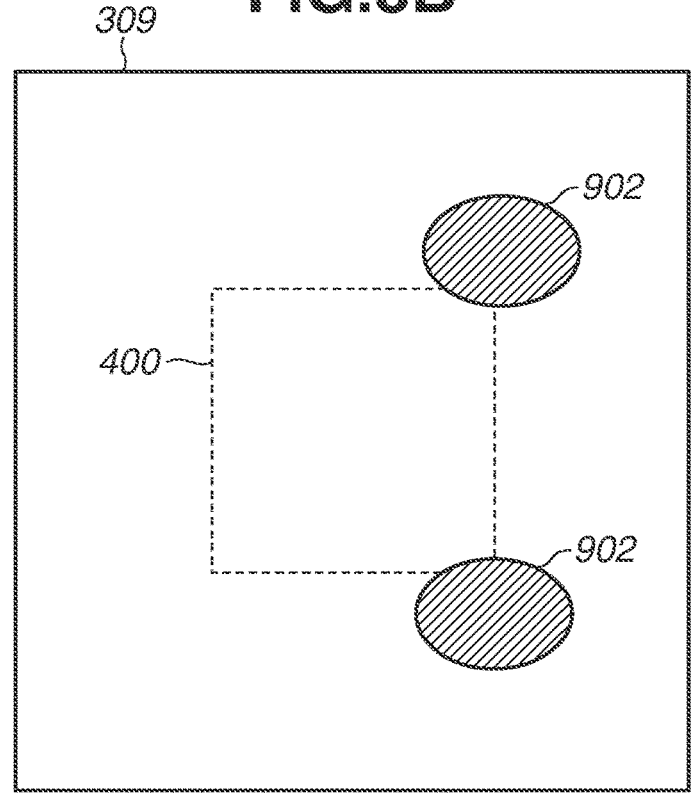
Figure 9:
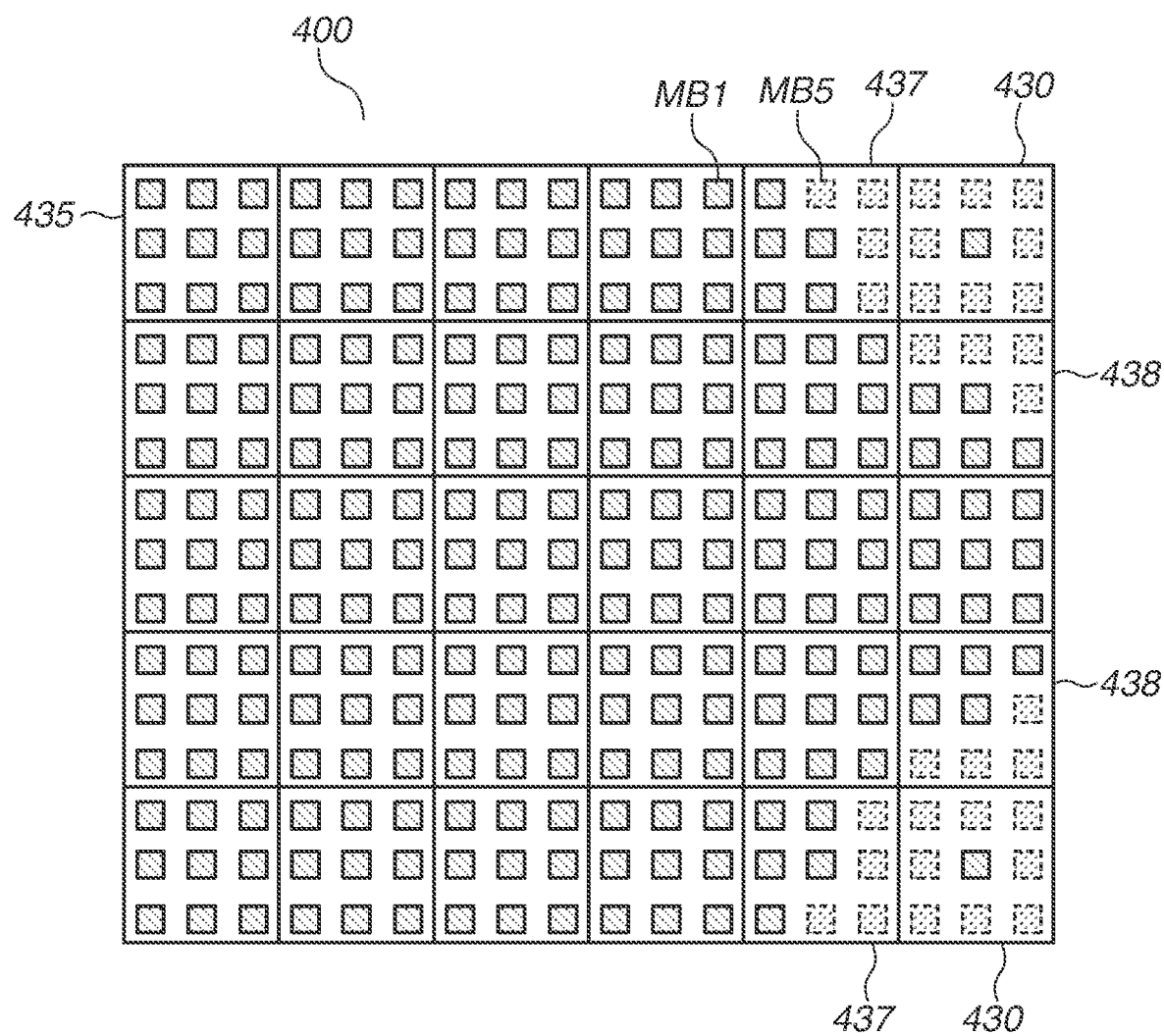
FIG. 9 is an arrangement diagram of a metal bonding portion of a pixel portion of the photoelectric conversion apparatus according to the fourth exemplary embodiment.

FIGS. 8A and 8B are schematic diagrams each illustrating an example of a thermal distribution generated by an operation of each component, as for FIGS. 2A and 2B described in the first exemplary embodiment. FIG. 9 is a diagram illustrating a configuration of arrangement of pixel blocks 430, 435, 437, and 438, and arrangement of metal bonding portions MB1-7 in the photoelectric conversion apparatus according to the present exemplary embodiment.

In FIGS. 2A and 2B, an operating frequency and power consumption vary between components. For example, because the output unit 420 in FIG. 2A and the signal processing control circuit 503 in FIG. 2B are components to perform digital signal processing, the output unit 420 and the signal processing control circuit 503 operate at higher frequency than other components. In such components, a power source fluctuation and power consumption sometimes become relatively larger than other components. The same applies to the signal generation circuits 412 and 423. Because the signal generation circuits 412 and 423 are circuits that generate a clock of an A/D conversion operation, a reference comparative voltage, and a clock for P/S conversion, a power source fluctuation and power consumption sometimes become relatively larger than other components. The influence of power fluctuation propagates to other components via a wiring line or a parasitic capacitance between wiring lines or an insulating layer. On the other hand, consumption current at a circuit operation time serves as a heat generation factor together with a resistance component of a power line or a grounding line, and a resistance component of an element included in each circuit such as a transistor element or a resistance element, for example. If power consumption is larger than other components, a local heat source is generated and a specific thermal distribution is generated in some cases. Even within one component, due to a difference in density of elements, or a difference in drive frequency or activation rate of transistors per unit time, a difference in power consumption, i.e., a thermal distribution is sometimes generated.

FIG. 8A is a schematic diagram illustrating an example of a thermal distribution of the chip 308. A thermal distribution 900 is a thermal distribution with the output unit 420 as a center, and a thermal distribution 901 is a thermal distribution with the signal generation circuit 423 as a center. A thermal distribution of the signal generation circuit 412 is omitted in FIG. 8A.

Among thermal distributions in FIG. 8A, the thermal distributions 900 especially affect the pixels 600 in the pixel region 400. The photoelectric conversion element 603 included in the pixel 600 generally generates noise called dark current. Because the dark current varies depending on the temperature, in the case of the thermal distribution as illustrated in FIG. 8A, the magnitude of dark current varies between the vicinity of the thermal distribution 900 and other regions in the pixel region 400, and image unevenness or two-dimensional shading is generated in a captured image, which can deteriorate image quality. FIG. 8B is a schematic diagram illustrating an example of a thermal distribution of the chip 309. A thermal distribution 902 is a thermal distribution with the signal processing control circuit 503 as a center. FIG. 8B illustrates the position of the pixel region 400 arranged on the chip 308. FIG. 8B illustrates that the thermal distribution 902 affects the pixel region 400 in a bonded state. The thermal distribution 902 due to the signal processing control circuit 503 also affects dark current of the pixel region 400, and image unevenness or two-dimensional shading is generated in a captured image, which can deteriorate image quality. In this manner, depending on the position of a component to be arranged, or a difference in power consumption, a thermal distribution is generated on the chip 308 or the chip 309, and image degradation can be generated due to the influence of the thermal distribution.

Thus, in the present exemplary embodiment, the number of metal bonding portions MB1 of a pixel block located in the vicinity of the thermal distribution 902, and the number of metal bonding portions MB1 of a pixel block located at a position farther from the thermal distribution 902 than the pixel block are varied. FIG. 9 illustrates a configuration in which pixel blocks 430, 435, 437, and 438 having different arrangement numbers and densities of metal bonding portions MB1 are arrayed. The pixel blocks 437 and 438 include pixel blocks having vertically-inverted arrangement patterns, and the same numerals are assigned thereto.

In the present exemplary embodiment, especially for the thermal distribution 902 due to the signal processing control circuit 503, an arrangement number or density of metal bonding portions MB1 is reduced and an arrangement pattern is adjusted. This is for reducing heat transfer from the chip 309 to the chip 308. The heat transfer will be described with reference to FIG. 1.

As described with reference to FIG. 1, in a state where the chip 308 and the chip 309 are bonded, the interlayer insulating films 107 and 136, and the wiring layers 114 and 143 are in contact with each other. The heat generated by the signal processing control circuit 503 is transferred based on thermal conductivity of interlayer insulating layers, contact layers, and wiring layers included in the wiring structure 191. The thermal conductivity of metal forming a wiring layer and a contact layer is generally higher than that of insulating material forming an insulating film. In other words, heat of members is transferred to the metal bonding portion MB1 to which a wiring layer and a contact layer are connected for connecting a signal line, a power source line and a grounding line, more easily than the metal bonding portion MBS. Thus, by employing a configuration in which numbers, densities, and/or arrangement patterns of metal bonding portions MB1 and metal bonding portions MB5 are adapted to the thermal distribution 902 as illustrated in FIG. 9, transfer of heat generated in the signal processing control circuit 503 can be reduced. With this configuration, the influence on the pixel region 400 by the thermal distribution 902 due to the signal processing control circuit 503 can be reduced, and image degradation caused by dark current unevenness and two-dimensional shading can be suppressed.

Figure 10:
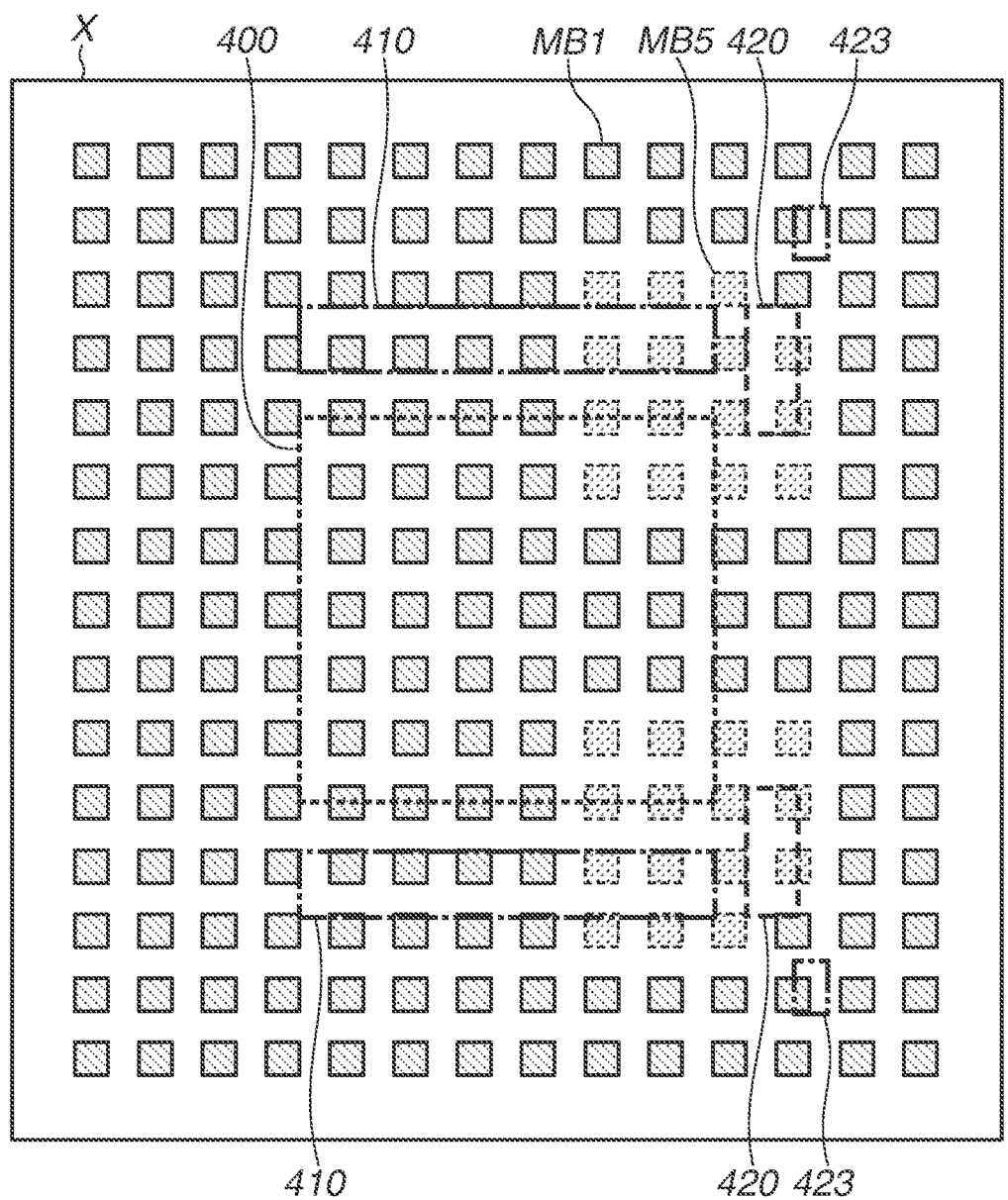
FIG. 10 is an arrangement diagram of the metal bonding portion of the photoelectric conversion apparatus according to the fourth exemplary embodiment.

In the present exemplary embodiment, a configuration of reducing heat transfer from the signal processing control circuit 503 to the pixel region 400 has been described, but the influence of a thermal distribution can be similarly generated also in the signal processing circuit 410 and other components. Thus, a configuration of adjusting heat transfer of other components may be employed. FIG. 10 is a diagram illustrating arrangement positions of the pixel region 400, the signal processing circuit 410, the output unit 420, and the signal generation circuit 423 on the bonding surface X, and illustrating an arrangement example of metal bonding portions MB1 to MB5.

A configuration of reducing heat transfer from the signal processing control circuit 503 by reducing an arrangement number and/or an arrangement density of metal bonding portions MB1 connecting with a control signal, a power source line or a grounding line connected to the signal processing circuit 410, with respect to the thermal distribution 902 described with reference to FIG. 8B is employed. On the other hand, if a thermal distribution does not affect other components like the signal generation circuit 423, a configuration of increasing an arrangement number or an arrangement density of metal bonding portions MB1 connecting with a control signal, a power source line or a grounding line connected to the signal generation circuit 423 is employed.

With this configuration, it is possible to increase heat transfer to the chip 309, diffuse heat generated in the signal generation circuit 423 to the chip 309, and obtain a heat release effect. With this configuration, it is possible to prevent a circuit malfunction and a property variation that may occur in the signal generation circuit 423 under high temperature. It is also possible to reduce mutual influence of a thermal distribution with the output unit 420 arranged nearby. Further, a higher effect can be obtained by, for example, increasing the ratio of connection to a wiring line connected to the outside of the photoelectric conversion apparatus like the pad wiring line 313B, or a wiring line with a large volume. For example, if the pad wiring line 313B is connected, a heat transfer route such as a substrate on which a package or the photoelectric conversion apparatus is mounted via a wire is increased, and a heat release amount can be increased. If the volume of a wiring line is large, heat capacity is increased and a heat variation amount can be reduced.

As described above, in the present exemplary embodiment, by adjusting an arrangement number, density, and/or an arrangement pattern of the metal bonding portions MB1 with respect to a thermal distribution that can be generated due to a difference in power consumption between components, heat transfer is adjusted. With this configuration, it is possible to suppress image degradation of a captured image due to a thermal distribution, and the influence of a temperature property variation of a circuit. The thermal distribution can be calculated by simulation dedicated for thermal analysis, calculation of power consumption, and from an activation rate of each circuit.

If a power source or a grounding potential is shared among members, an arrangement number, an arrangement density, and arrangement positions and pattern of the metal bonding portions MB1 may be adjusted with respect to a power fluctuation, which has not been described in the present exemplary embodiment. With this configuration, the influence of a power source fluctuation via metal between components can be reduced in some cases.

In the above description, an aggregate of pixels 600 in the first accumulation time and an aggregate of pixels 600 in the second accumulation time different from the first accumulation time are both referred to as pixel blocks. In the present exemplary embodiment, pixel blocks need not be aggregates of pixels 600 in different accumulation times. For example, in the pixel region 400, m (m is an integer larger than or equal to 4) pixels 600 may be regarded as a block 1, m pixels 600 arranged at positions different from the block 1 may be regarded as a block 2, and the block 1 and the block 2 may be compared. In a pixel region, if the block 2 is arranged farther from a signal processing control circuit causing the thermal distribution 900, than the block 1, the number of the metal bonding portions MB1 arranged to correspond to the block 2 may be made larger than the number of the metal bonding portions MB1 arranged to correspond to the block 1.

A photoelectric conversion apparatus according to a fifth exemplary embodiment of the present disclosure will be described with reference to FIGS. 11 to 13B. The photoelectric conversion apparatus according to the present exemplary embodiment is different from the photoelectric conversion apparatus according to the first exemplary embodiment in that a pattern MBP of a metal bonding portion is used in place of the metal bonding portion MB5. Components similar to those of the photoelectric conversion apparatuses according to the first to fourth exemplary embodiments illustrated in FIGS. 1 to 10 are assigned the same reference numerals, and the description thereof will be omitted or simplified.

Figure 12A:
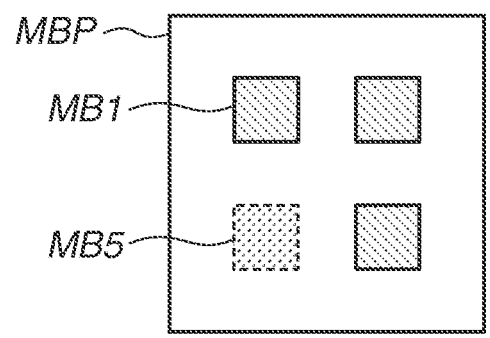
FIGS. 12A, 12B, and 12C each illustrate a configuration example of a connection region of the photoelectric conversion apparatus according to the fifth exemplary embodiment.
Figure 12B:
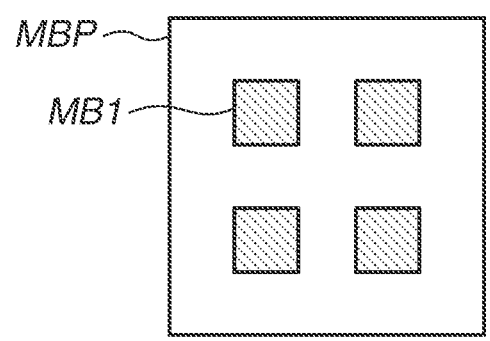
Figure 12C:
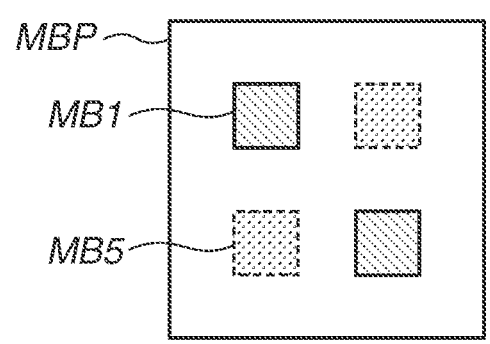
Figure 13A:
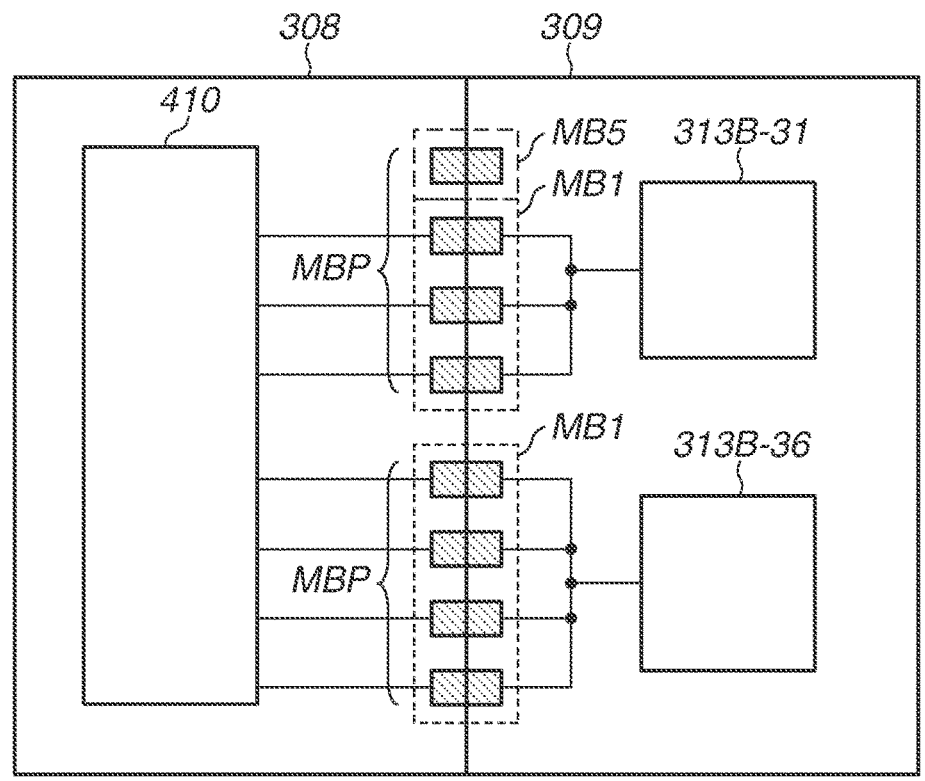
FIGS. 13A and 13B are schematic diagrams illustrating a connection relationship between members of the photoelectric conversion apparatus according to the fifth exemplary embodiment.
Figure 13B:
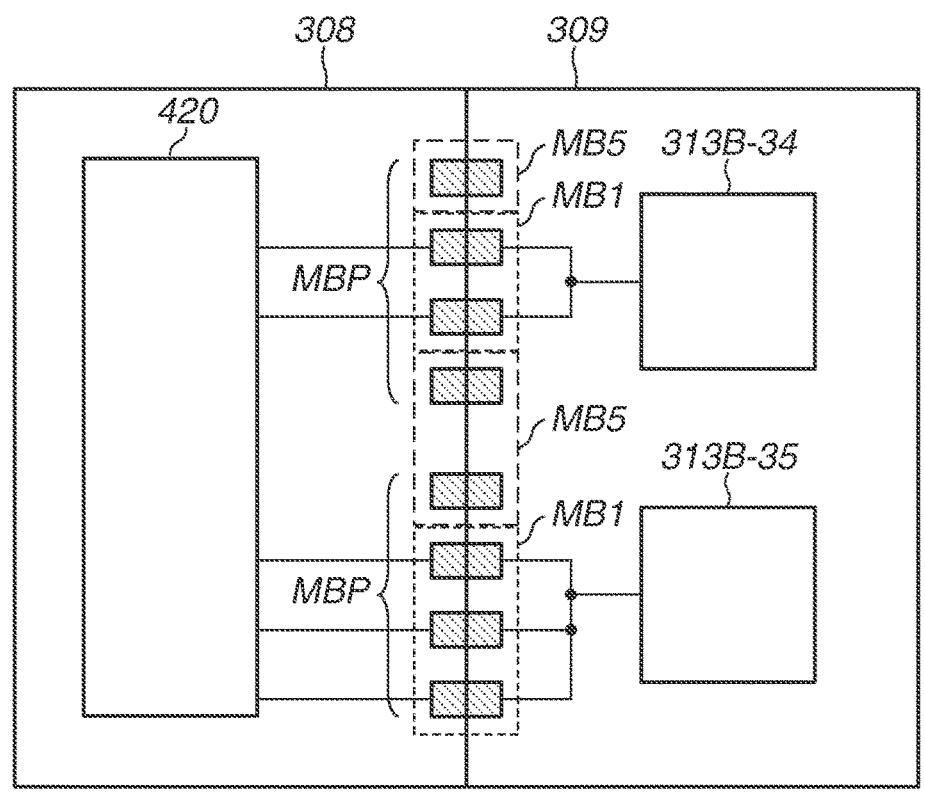

FIG. 11 is a diagram illustrating a relationship between an arrangement position of each component, arrangement of the pad wiring line 313, and arrangement of a metal bonding portion described in the first exemplary embodiment with reference to FIGS. 2A and 2B. FIGS. 12A, 12B, and 12C are diagrams illustrating an arrangement number and density of connection regions. FIGS. 13A and 13B are diagrams illustrating a connection relationship between components arranged on the chip 308, and a pad wiring line arranged on the chip 309.

FIG. 11 illustrates arrangement positions of the pixel region 400, the signal processing circuit 410, the output unit 420, and the pad wiring line 313 on the bonding surface X, and patterns MBP of metal bonding portions illustrated in FIGS. 12A to 12C are arranged in place of the metal bonding portions MB5. In FIG. 11, a peripheral region includes a first block overlapping o (o is an integer larger than or equal to 3) metal bonding portions MB in a planar view, and a second block. The second block has the same area as the first block, and overlaps the same number of metal bonding portions as the number of metal bonding portions arranged in the first block. In addition, the number of the metal bonding portions MB1 arranged at positions overlapping the first block in a planar view, and the number of the metal bonding portions MB1 arranged at positions overlapping the second block in a planar view are different.

As illustrated in FIGS. 12A to 12C, in the pattern MBP of metal bonding portions, a plurality of metal bonding portions MB is arranged. FIG. 12A to 12C illustrate four metal bonding portions MB, but the number of metal bonding portions MB is not limited to four. For the sake of explanatory convenience, FIG. 11 illustrates a configuration of a connection relationship different from the connection relationship between the pad wiring line 313 and each component, which has been described with reference to FIG. 2A. In the pixel region 400, a power source potential or a grounding potential is supplied from four pads corresponding to pad wiring lines 313B-32, 313B-33, 313B-37, and 313B-38. A power source potential or a grounding potential is supplied to the signal processing circuit 410 from the right and left two pads corresponding to pad wiring lines 313B-31 and 313B-36. In the present exemplary embodiment, the output unit 420 is LVDS that differentially outputs a digital output, and differential output two terminals are connected to two pads corresponding to the pad wiring lines 313B-34 and 313B-35. For example, FIG. 12A illustrates the metal bonding portions MB arranged at positions overlapping the first block, and FIG. 12B illustrates the metal bonding portions MB arranged at positions overlapping the second block. At this time, the numbers of the metal bonding portions MB arranged in the respective blocks are the same, but the numbers of the metal bonding portions MB1 connecting the semiconductor element layer 101 and the semiconductor element layer 130 are different between the blocks. In this manner, in a peripheral region, the number of the metal bonding portions MB1 may be varied between blocks.

FIG. 13A is a schematic diagram illustrating a connection relationship between the signal processing circuit 410 and the pad wiring lines 313B-31 and 313B-36. In FIG. 11, the pad wiring lines 313B-31 and 313B-36 are connected to the signal processing circuit 410 via the pattern MBP of metal bonding portions. In FIG. 13A, a pattern MBP of metal bonding portions connected to the pad wiring line 313B-31 includes three metal bonding portions MB1 and one metal bonding portion as illustrated in FIG. 12A. On the other hand, a pattern MBP of metal bonding portions connected to the pad wiring line 313B-36 includes four metal bonding portions MB1 as illustrated in FIG. 12B.

A component arranged with extending in one direction or two directions so as to correspond to the pixel region 400 like the signal processing circuit 410 sometimes receives a power source potential or a grounding potential supplied from a plurality of pads, for achieving low resistance of a power source or a grounding wiring line. For example, by receiving a power source potential or a grounding potential supplied from the left and the right as in the present exemplary embodiment, it is possible to reduce interconnection resistance and also reduce the influence of a voltage drop. In this case, it is desirable to equalize a resistance value of a route from the pad wiring line 313B-31 to the signal processing circuit 410, and a resistance value of a route from the pad wiring line 313B-36 to the signal processing circuit 410. For example, if resistance values are different between the right and left, a gradient of a voltage drop of power or a grounding potential is generated corresponding to a resistance value. In this case, a relationship of a potential gradient with another reference potential (not illustrated) or a control signal (not illustrated) supplied from the right and left of the signal processing circuit 410 is deteriorated, and malfunction of signal processing or an anomalous output property is generated in some cases. For example, shading slanted toward either left or right is sometimes generated in an A/D conversion output. Especially in a photoelectric conversion apparatus, the pixel region 400 is designed to have an optically symmetrical property. Thus, an optical property of a captured image may be affected by shading slanted toward either one direction of the right and left directions of the signal processing circuit 410.

In the present exemplary embodiment, due to arrangement positions of the pad wiring line 313B-31 and the pad wiring line 313B-36, interconnection distances from the pad wiring lines and the signal processing circuit 410 are different between the right and left. Accordingly, if wiring lines with the same line width are arranged, resistance of a route from a pad to the signal processing circuit 410 varies between the right and left. Interconnection resistances can be equalized by adjusting line widths and wiring patterns, but the adjustment is sometimes not easy due to constraints arising from the relationship with other components. By adjusting the numbers of the metal bonding portions MB1 connected to the pad wiring line 313B-31 and the pad wiring line 313B-36 as illustrated in FIG. 13A, it is possible to easily adjust resistance components different between the right and left. With this configuration, it is possible to symmetrically supply a power source potential or a grounding potential.

FIG. 13B is a schematic diagram illustrating a connection relationship between differential output two terminals of the output unit 420, and the pad wiring lines 313B-34 and 313B-35. Transmission paths of wiring lines of the differential output two terminals need to be designed in such a manner as to equalize impedances of the respective transmission paths in consideration of the impedance of a transmission path (not illustrated) outside the photoelectric conversion apparatus. Thus, an arrangement relationship between an output terminal of the output unit 420 and a pad wiring line, output wiring lines are symmetrically arranged, but such symmetric arrangement cannot be easily implemented in some cases due to positions of other components and pad wiring lines to be arranged. In this case also, as illustrated in FIG. 12B, a pattern MBP of metal bonding portions including two metal bonding portions MB1 and two metal bonding portions MB5 as illustrated in FIG. 12C, for example, is arranged for the pad wiring line 313B-34. On the other hand, a pattern MBP of metal bonding portions including three metal bonding portions MB1 and one metal bonding portion MB5 as illustrated in FIG. 12A, for example, is arranged for the pad wiring line 313B-35. In this manner, by adjusting the number or density of the metal bonding portions MB1, the impedance of transmission paths of differential output two terminals can be easily adjusted.

The same applies to the pixel region 400. By adjusting the configuration of wiring lines and patterns MBP of metal bonding portions connecting to four pads, it is possible to supply a power source potential or a grounding potential vertically and horizontally symmetrically.

As described above, the number of patterns MBP of metal bonding portions, and the number or a distribution of the metal bonding portions MB1 and MB 5 in the pattern MBP of metal bonding portions are not limited to the configurations illustrated in FIGS. 12A to 12C. In addition, at least any one of the metal bonding portions MB2 to MB5 may be used in place of the metal bonding portion MB5. In the present exemplary embodiment, a configuration example focused on a connection relationship between pad wiring lines and each component has been described, but the configuration of the present exemplary embodiment can also be applied to a signal route including a metal bonding portion.

As described above, by adjusting the number or density of the metal bonding portions MB for a wiring line including the metal bonding portion MB, such as a power line, a grounding line, or a signal line, impedance including interconnection resistance can be easily adjusted.

A photoelectric conversion apparatus according to a sixth exemplary embodiment of the present disclosure will be described with reference to FIG. 14. Components similar to those of the photoelectric conversion apparatuses according to the first to fifth exemplary embodiments illustrated in FIGS. 1 to 13B are assigned the same reference numerals, and the description thereof will be omitted or simplified.

Figure 14:
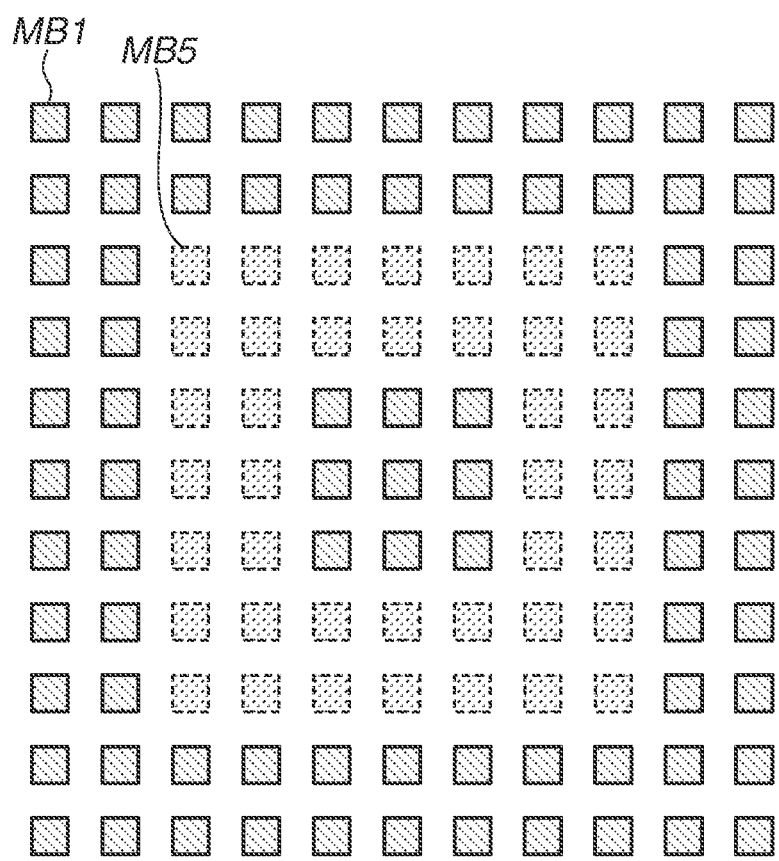
FIG. 14 is an arrangement diagram of a metal bonding portion of a photoelectric conversion apparatus according to a sixth exemplary embodiment.

FIG. 14 is a diagram illustrating arrangement of metal bonding portions for one output line of differential output two terminals as for the connection of the output unit 420 and the pad wiring lines 313B-34 and 313B-35 described in the fifth exemplary embodiment with reference to FIG. 13B.

In a region overlapping the output unit 420 in a planar view, nine metal bonding portions MB1 in total are arranged in three rows and three columns, and one of differential output two terminals of the output unit 420 is connected. In addition, metal bonding portions including any of the metal bonding portions MB2 to MB5 are arranged in the two rows and two columns so as to surround the nine metal bonding portions MB1 in a planar view. Further, on the outside of the metal bonding portions MB2 to MB5, the metal bonding portions MB1 are arranged, and a signal line different from a differential output line of the output unit 420, a power source line and a grounding line are connected. The other output line also has arrangement and a connection configuration similar to FIG. 14.

If the output unit 420 has a differential output format such as LVDS, a certain amount of current flows in the metal bonding portions MB1 arranged at the center via an end element (not illustrated) on the outside of the photoelectric conversion apparatus. In this case, a magnetic field is generated around the metal bonding portions MB1 in which current flows. If digital data changes, a current flowing direction also changes, and a magnetic field changes as well. For example, if the metal bonding portions MB2 to MB5 to which a power source or a signal line of another component is connected are arranged adjacently to the center metal bonding portions MB1, the influence of a changing magnetic field affects in some cases. For example, depending on a change in an image capturing target subject, a variation in digital data occurs, and a power fluctuation of another component is caused in tandem with a current variation caused by the variation in digital data. A malfunction or noise may be accordingly caused. This can cause image degradation of a captured image.

In the present exemplary embodiment, by reducing the number or density of the metal bonding portions MB1 in the peripheral of the metal bonding portions MB1 to which a differential output line is connected, it is possible to reduce the influence of a magnetic field variation on a power source line or a signal line of another component. In a component that performs digital signal processing other than a differential output terminal, a variation in power source current via a metal bonding portion is large in some cases. Also in these cases, in a similar manner, by reducing the number or density of peripheral metal bonding portions MB1 for a connection region of a power source line or a grounding line with a large current variation, it is possible to reduce the influence of a magnetic field variation on a power source line or a signal line of another component.

Figure 15:
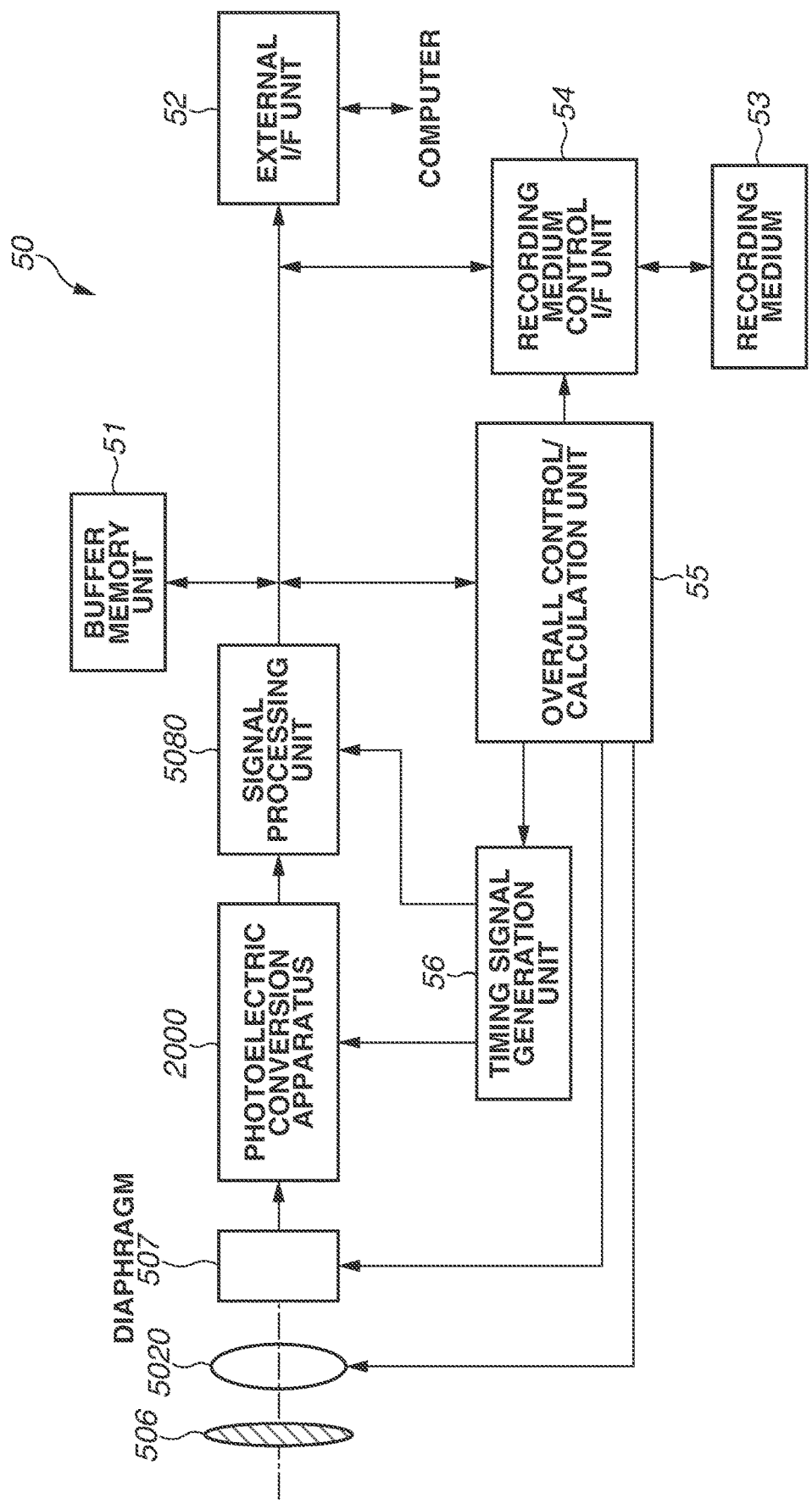
FIG. 15 is a block diagram of a photoelectric conversion system according to a seventh exemplary embodiment.

FIG. 15 is a block diagram illustrating a configuration of a photoelectric conversion system 50 according to a seventh exemplary embodiment. The photoelectric conversion system 50 according to the present exemplary embodiment includes a photoelectric conversion apparatus 2000 to which the configuration of any of the above-described photoelectric conversion apparatuses is applied. FIG. 15 illustrates an imaging system as the photoelectric conversion system 50. Specific examples of the imaging system include a digital still camera, a digital camcorder, and a monitoring camera. The photoelectric conversion system 50 includes the photoelectric conversion apparatus 2000, a lens 5020, a diaphragm 507, and a barrier 506 for protecting the lens 5020. The photoelectric conversion system 50 includes a signal processing unit 5080 (image signal generation unit) that processes an output signal output from the photoelectric conversion apparatus 2000. The signal processing unit 5080 performs an operation of signal processing of outputting an input signal after performing various types of correction and compression on the input signal as necessary. The signal processing unit 5080 may have a function of executing AD conversion processing on an output signal output from the photoelectric conversion apparatus 2000. The photoelectric conversion system 50 further includes a buffer memory unit 51 for temporarily storing image data, and an external interface unit (external I/F unit) 52 for communicating with an external computer. The photoelectric conversion system 50 further includes a recording medium 53 such as a semiconductor memory for recording or reading out imaging data, and a recording medium control interface unit (recording medium control I/F unit) 54 for recording imaging data onto or reading out imaging data from the recording medium 53.

The photoelectric conversion system 50 further includes an overall control/calculation unit 55 that performs various types of calculation and controls the entire digital still camera, and a timing signal generation unit 56 that outputs various timing signals to the photoelectric conversion apparatus 2000 and the signal processing unit 5080. The photoelectric conversion apparatus 2000 outputs an image signal to the signal processing unit 5080. The signal processing unit 5080 executes predetermined signal processing on the image signal output from the photoelectric conversion apparatus 2000, and outputs image data. In addition, the signal processing unit 5080 generates an image using the image signal.

By forming a photoelectric conversion system using the photoelectric conversion apparatus according to each of the above-described exemplary embodiments, an imaging system that can acquire a higher quality image can be achieved.

Figure 16A:
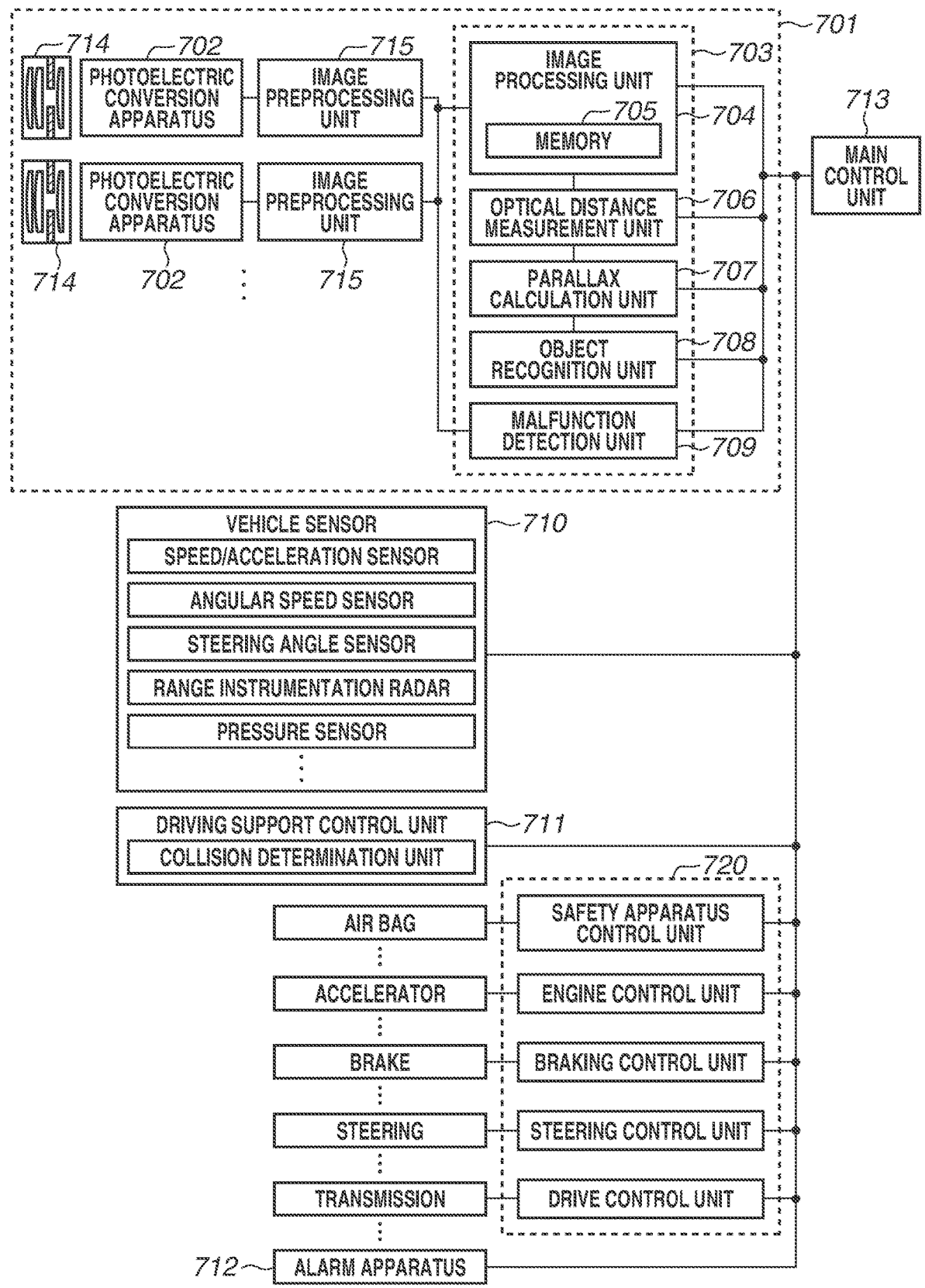

A photoelectric conversion system and a movable body according to an eighth exemplary embodiment will be described with reference to FIGS. 16A and 16B. In the present exemplary embodiment, an example of an imaging system related to an in-vehicle camera will be described. FIGS. 16A and 16B illustrate an example of a vehicle system and an imaging system mounted on the vehicle system. A photoelectric conversion system 701 includes a photoelectric conversion apparatus 702, an image preprocessing unit 715, an integrated circuit 703, and an optical system 714. The optical system 714 forms an optical image of a subject on the photoelectric conversion apparatus 702. The photoelectric conversion apparatus 702 converts the optical image of the subject that has been formed by the optical system 714, into an electrical signal. The photoelectric conversion apparatus 702 is any of the photoelectric conversion apparatuses according to the above-described exemplary embodiments. The image preprocessing unit 715 performs predetermined signal processing on a signal output from the photoelectric conversion apparatus 702. The photoelectric conversion system 701 includes at least two sets of the optical systems 714, the photoelectric conversion apparatuses 702, and the image preprocessing units 715, and an output from the image preprocessing unit 715 of each set is input to the integrated circuit 703.

The integrated circuit 703 is an integrated circuit intended for a photoelectric conversion system, and includes an image processing unit 704 including a memory 705, an optical distance measurement unit 706, a parallax calculation unit 707, an object recognition unit 708, and a malfunction detection unit 709. The image processing unit 704 performs image processing such as development processing and defect correction on an output signal of the image preprocessing units 715. The memory 705 temporarily stores a captured image, and stores a defect position of an imaging pixel. The optical distance measurement unit 706 performs focusing of a subject and distance measurement. The parallax calculation unit 707 calculates a parallax (phase difference of parallax image) from a plurality of pieces of image data acquired by a plurality of photoelectric conversion apparatuses 702. The object recognition unit 708 detects a subject such as a vehicle, a road, a traffic sign, or a human. If the malfunction detection unit 709 detects a malfunction of the photoelectric conversion apparatus 702, the malfunction detection unit 709 issues a malfunction alarm to a main control unit 713.

The integrated circuit 703 may be implemented by dedicated hardware, may be implemented by software modules, or may be implemented by a combination thereof. In addition, the integrated circuit 703 may be implemented by a field programmable gate array (FPGA) or an application specific integrated circuit (ASIC), or may be implemented by a combination thereof.

The main control unit 713 controls operations of the photoelectric conversion system 701, a vehicle sensor 710, and a control unit 720. A configuration in which the main control unit 713 is not included, and the photoelectric conversion system 701, the vehicle sensor 710, and the control unit 720 individually include communication interfaces and transmit and receive control signals via a communication network (e.g., Controller Area Network (CAN) standard) can also be employed.

The integrated circuit 703 has a function of receiving a control signal from the main control unit 713, or transmitting a control signal and a setting value to the photoelectric conversion apparatus 702 using a control unit of itself. For example, the integrated circuit 703 transmits a setting for driving a voltage switch 13 in the photoelectric conversion apparatus 702, or a setting of switching the voltage switch 13 for each frame.

The photoelectric conversion system 701 is connected to the vehicle sensor 710, and can detect a vehicle driving state such as vehicle speed, a yaw rate, and a steering angle, a vehicle exterior environment, and states of another vehicle and an obstacle. The vehicle sensor 710 also serves as a distance information acquisition unit that acquires distance information regarding a distance to a target object, from a parallax image. In addition, the photoelectric conversion system 701 is connected to a driving support control unit 711 that performs various types of driving support such as automatic steering, automatic driving, and a collision prevention function. In particular, the collision prevention function estimates or determines the presence or absence of collision with another vehicle or an obstacle based on detection result of the photoelectric conversion system 701 and the vehicle sensor 710. The collision prevention function thereby performs avoidance control if collision is estimated, or activates a safety apparatus at the time of collision.

In addition, the photoelectric conversion system 701 is also connected to an alarm apparatus 712 that issues a warning to a driver based on a determination result obtained by a collision determination unit. For example, if the determination result obtained by the collision determination unit indicates that collision is highly likely to occur, the main control unit 713 performs vehicle control for avoiding collision or reducing damages by braking, releasing a gas pedal, or suppressing engine output. The alarm apparatus 712 issues an alarm to a user by sounding an alarm such as warning sound, displaying warning information on a display unit screen of a car navigation system or a meter panel, or vibrating a seatbelt or a steering wheel.

In the present exemplary embodiment, the photoelectric conversion system 701 captures an image of the periphery of a vehicle such as a front side or a rear side thereof, for example. FIG. 16B illustrates an arrangement example of the photoelectric conversion system 701 for capturing an image of a vehicle front side using the photoelectric conversion system 701.

In the present exemplary embodiment, the description has been given of an example in which control is performed so as not to collide with another vehicle. The photoelectric conversion system can also be applied to the control for performing automatic operation by following another vehicle, or the control for performing automatic operation so as not to deviate from a lane. Further, the photoelectric conversion system 701 can be applied to a movable body (movable apparatus) such as a vessel, an aircraft, or an industrial robot aside from a vehicle such as an automobile. Moreover, the photoelectric conversion system 701 can be applied to a device that extensively uses object recognition, such as an intelligent transport system (ITS), in addition to a movable body.

Other Exemplary Embodiments

The exemplary embodiments have been described above, but the present disclosure is not limited to these exemplary embodiments, and various changes and modifications can be made. In addition, the exemplary embodiments can be applied to each other.

According to an exemplary embodiment of the present disclosure, it is possible to provide a photoelectric conversion apparatus with an improved property.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-107919, filed Jun. 23, 2020, which is hereby incorporated by reference herein in its entirety.

What is claimed is:

1. A photoelectric conversion apparatus comprising:
   a first chip including a first semiconductor element layer including a plurality of pixel circuits arranged in rows and columns; and
   a second chip including a second semiconductor element layer,
   wherein the first chip and the second chip are bonded by a plurality of metal bonding portions between the first semiconductor element layer and the second semiconductor element layer,
   wherein the plurality of pixel circuits includes a first pixel block including n pixel circuits, where n is an integer larger than or equal to 3, a second pixel block including a same number of pixel circuits as the first pixel block, and a third pixel block including the same number of pixel circuits as the first pixel block,
   wherein the plurality of metal bonding portions includes first metal bonding portions connecting the first semiconductor element layer and the second semiconductor element layer, and
   wherein an arrangement pattern in the first pixel block of the first metal bonding portions arranged at positions overlapping the first pixel block in a planar view and an arrangement pattern in the second pixel block of the first metal bonding portions arranged at positions overlapping the second pixel block in a planar view are different, and
   at least three adjacent pixel blocks, each of the at least three adjacent pixel blocks having pixel circuits in the plurality of pixel circuits arranged in one row, have arrangement patterns of metal bonding portions different from each other.

2. The photoelectric conversion apparatus according to claim 1, wherein the arrangement pattern in the first pixel block differs from the arrangement pattern in the second pixel block in that the number of the first metal bonding portions arranged at positions overlapping the first pixel block in a planar view is smaller than the number of the first metal bonding portions arranged at positions overlapping the second pixel block in a planar view.

3. The photoelectric conversion apparatus according to claim 1, further comprising a pad wiring line to which a potential is supplied,
   wherein a distance from the pad wiring line to the first pixel block is shorter than a distance from the pad wiring line to the second pixel block.

4. The photoelectric conversion apparatus according to claim 1, further wherein, in a planar view, a distance from the first pixel block to a center of a pixel region including the plurality of pixel circuits is longer than a distance from the second pixel block to the center of the pixel region.

5. The photoelectric conversion apparatus according to claim 1,
   wherein each of the plurality of pixel circuits includes a photoelectric conversion element,
   wherein photoelectric conversion elements of the n pixel circuits arranged in the first pixel block are covered with a light shielding portion, and
   wherein the photoelectric conversion elements are arranged so that light enters the same number of pixel circuits as the first pixel block that are arranged in the second pixel block.

6. The photoelectric conversion apparatus according to claim 1, further comprising a signal processing circuit,
   wherein a distance between the first pixel block and the signal processing circuit is shorter than a distance between the second pixel block and the signal processing circuit.

7. The photoelectric conversion apparatus according to claim 6,
   wherein the signal processing circuit includes an output unit, and
   wherein a distance between the first pixel block and the output unit is shorter than a distance between the second pixel block and the output unit.

8. The photoelectric conversion apparatus according to claim 1,
   wherein the number of the first metal bonding portions in the second pixel block that are arranged at positions overlapping the second pixel block in a planar view is two or more, and
   wherein at least one first metal bonding portion of the two or more first metal bonding portions in the second pixel block and an arrangement pattern in the first pixel block of the first metal bonding portions arranged at positions overlapping the first pixel block in a planar view are different.

9. The photoelectric conversion apparatus according to claim 1, wherein the n pixel circuits of the first pixel block and the second pixel block including a same number of pixel circuits as the first pixel block of the second pixel block each include pixel circuits arranged on m columns and l rows, wherein m is an integer larger than or equal to 2, and l is an integer larger than or equal to 2.

10. The photoelectric conversion apparatus according to claim 1, wherein, in the first pixel block, an accumulation period of signal electric charges in the n pixel circuits is controlled in a first period, and in the second pixel block, an accumulation period of signal electric charges in a same number of pixel circuits as the first pixel block is controlled in a second period different from the first period.

11. The photoelectric conversion apparatus according to claim 10,
wherein the plurality of pixel circuits includes a third pixel block including a same number of pixel circuits as the first pixel block,
wherein, in the third pixel block, an accumulation period of signal electric charges in the same number of pixel circuits as the first pixel block is controlled in a third period different from the first period and the second period, and
wherein, in a planar view, the number of the first metal bonding portions arranged at positions overlapping the first pixel block, the number of the first metal bonding portions arranged at positions overlapping the second pixel block, and the number of the first metal bonding portions arranged at positions overlapping the third pixel block are different from one another.

12. The photoelectric conversion apparatus according to claim 10, further comprising an output unit,
wherein, in a planar view, a distance between the first pixel block and the output unit is shorter than a distance between the second pixel block and the output unit.

13. The photoelectric conversion apparatus according to claim 1,
wherein the plurality of metal bonding portions includes a second metal bonding portion unconnected with the first semiconductor element layer or the second semiconductor element layer, or unconnected with the first semiconductor element layer and the second semiconductor element layer, and
wherein, in a planar view, the number of the second metal bonding portions arranged at positions overlapping the first pixel block is larger than the number of the second metal bonding portions arranged at positions overlapping the second pixel block.

14. The photoelectric conversion apparatus according to claim 1, wherein the first pixel block and the second pixel block are adjacently arranged.

15. The photoelectric conversion apparatus according to claim 1, wherein an output line is connected to the first metal bonding portion.

16. The photoelectric conversion apparatus according to claim 15, wherein a major component of the plurality of metal bonding portions is copper.

17. The photoelectric conversion apparatus according to claim 16,
wherein each of the plurality of pixel circuits includes a photoelectric conversion element, and
wherein the plurality of metal bonding portions is arranged in such a manner that the one metal bonding portion corresponds to the one photoelectric conversion element.

18. A photoelectric conversion system comprising:
the photoelectric conversion apparatus according to claim 1; and
a signal processing unit configured to process a signal obtained by the photoelectric conversion apparatus.

19. A movable body control system comprising:
the photoelectric conversion apparatus according to claim 1;
a distance information acquisition unit configured to acquire distance information regarding a distance to a target object based on a signal from the photoelectric conversion apparatus; and
a control unit configured to control a movable body based on the distance information.

20. A semiconductor apparatus comprising:
a first chip including a first semiconductor element layer including a plurality of pixel circuits arranged in rows and columns; and
a second chip including a second semiconductor element layer,
wherein the first chip and the second chip are bonded by a plurality of metal bonding portions between the first semiconductor element layer and the second semiconductor element layer,
wherein the plurality of metal bonding portions includes a first metal bonding portion connecting the first semiconductor element layer and the second semiconductor element layer,
wherein a first block overlapping o metal bonding portions of the plurality of metal bonding portions in a planar view, wherein o is an integer larger than or equal to 3, a second block having a same area as the first block in a planar view, and overlapping a same number of metal bonding portions as the metal bonding portions arranged in the first block are included, and a third block having the same area as the first block in a planar view, and overlapping the same number of metal bonding portions as the metal bonding portions arranged in the first block are included,
wherein the second block is adjacent to the first block and the third block in one of a row direction and a column direction, and
wherein each of the first block, the second block, and the third block has an arrangement pattern of metal bonding portions different from each other.

21. The semiconductor apparatus according to claim 20, wherein the arrangement pattern in the first block differs from the arrangement pattern in the second block in that the number of the first metal bonding portions arranged at positions overlapping the first block in a planar view is smaller than the number of the first metal bonding portions arranged at positions overlapping the second block in a planar view.

22. The semiconductor apparatus according to claim 21, wherein a major component of the plurality of metal bonding portions is copper.

23. The semiconductor apparatus according to claim 22,
wherein the first semiconductor element layer includes a plurality of pixel circuits,
wherein each of the plurality of pixel circuits includes a photoelectric conversion element, and
wherein the plurality of metal bonding portions is arranged in such a manner that the one metal bonding portion corresponds to the one photoelectric conversion element.

24. The semiconductor apparatus according to claim 22, further comprising a pad wiring line to which a potential is supplied from an outside,
wherein a distance from the pad wiring line to the first pixel block is shorter than a distance from the pad wiring line to the second pixel block.

25. The semiconductor apparatus according to claim 22, further comprising a signal processing circuit, wherein a distance between the first pixel block and the signal processing circuit is shorter than a distance between the second pixel block and the signal processing circuit.

26. The semiconductor apparatus according to claim 25, wherein the signal processing circuit includes an output unit, and wherein a distance between the first pixel block and the output unit is shorter than a distance between the second pixel block and the output unit.

27. A photoelectric conversion system comprising:

the semiconductor apparatus according to claim 21; and a signal processing unit configured to process a signal obtained by the semiconductor apparatus.

28. A movable body comprising:

the semiconductor apparatus according to claim 21;

a distance information acquisition unit configured to acquire distance information regarding a distance to a target object based on a signal from the semiconductor apparatus; and a control unit configured to control a movable body based on the distance information.

* * * * *